(12) United States Patent
Masuoka et al.

(10) Patent No.: US 12,108,585 B2
(45) Date of Patent: Oct. 1, 2024

(54) MANUFACTURING METHOD OF PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 331 days.

(21) Appl. No.: 17/539,431

(22) Filed: Dec. 1, 2021

(65) Prior Publication Data

US 2022/0093611 A1    Mar. 24, 2022

Related U.S. Application Data

(63) Continuation of application No. PCT/JP2019/022366, filed on Jun. 5, 2019.

(51) Int. Cl.
*H10B 10/00* (2023.01)
*H01L 29/66* (2006.01)
*H01L 29/78* (2006.01)

(52) U.S. Cl.
CPC ....... *H10B 10/12* (2023.02); *H01L 29/66666* (2013.01); *H01L 29/7827* (2013.01)

(58) Field of Classification Search
CPC ............. H10B 10/12; H01L 29/66666; H01L 29/7827; H01L 27/0207; Y10S 257/904
USPC .......................................................... 438/212
See application file for complete search history.

(56) References Cited

U.S. PATENT DOCUMENTS

| | | | |
|---|---|---|---|
| 8,975,705 B2 * | 3/2015 | Masuoka ......... | H01L 29/42392 257/329 |
| 9,530,866 B1 * | 12/2016 | Zhang ............... | B82Y 10/00 |
| 2010/0219483 A1 | 9/2010 | Masuoka et al. | |
| 2011/0018056 A1 | 1/2011 | Takeuchi | |

(Continued)

FOREIGN PATENT DOCUMENTS

| | | |
|---|---|---|
| JP | H02-188966 A | 7/1990 |
| JP | 2010-245293 A | 10/2010 |

(Continued)

OTHER PUBLICATIONS

English translation of International Preliminary Report on Patentability in Application No. PCT/JP2019/022366, dated Dec. 9, 2021, 10 pages.

(Continued)

*Primary Examiner* — Mohammad M Hoque
(74) *Attorney, Agent, or Firm* — Crowell & Moring LLP

(57) ABSTRACT

A gate TiN layer of adjacent Si pillars among Si pillars contacts at entire channel length in a vertical direction. $SiO_2$ layers are formed, surrounding the Si pillars, and mask material layers on top thereof, and being spaced from each other. Then, a SiN layer is formed surrounding the $SiO_2$ layers. Then, the mask material layers and the $SiO_2$ layers are removed. Then, a $P^+$ layer and $N^+$ layers which upper surfaces are lower than an upper surface position of the SiN layer are formed surrounding each top of the Si pillars by selective epitaxial crystal growth method.

10 Claims, 26 Drawing Sheets

(56) References Cited

U.S. PATENT DOCUMENTS

| | | |
|---|---|---|
| 2017/0309632 A1 | 10/2017 | Masuoka et al. |
| 2017/0323969 A1 | 11/2017 | Masuoka et al. |
| 2018/0012896 A1 | 1/2018 | Masuoka et al. |
| 2019/0109140 A1 | 4/2019 | Masuoka et al. |
| 2019/0123053 A1 | 4/2019 | Masuoka et al. |
| 2019/0148387 A1 | 5/2019 | Masuoka et al. |
| 2019/0157166 A1 | 5/2019 | Masuoka et al. |

FOREIGN PATENT DOCUMENTS

| | | |
|---|---|---|
| WO | WO 2009/128337 A1 | 10/2009 |
| WO | WO 2017/208486 A1 | 12/2017 |
| WO | WO 2018/123823 A1 | 7/2018 |
| WO | WO 2019/087328 A1 | 5/2019 |

OTHER PUBLICATIONS

Takato et al., "Impact of Surrounding Gate Transistor (SGT) for Ultra-High-Density LSI's" IEEE Transaction on Electron Devices, vol. 38, No. 3, pp. 573-578 (Mar. 1991).

Raley et al., "Self-aligned quadruple patterning integration using spacer on spacer pitch splitting at the resist level for sub-32nm pitch applications" Proc. of SPIE vol. 9782, (2016).

International Search Report, and Written Opinion, in Application No. PCT/JP2019/022366, dated Aug. 13, 2019, including English translation of Search Report, 13 pages.

International Preliminary Report on Patentability in Application No. PCT/JP2019/022366, dated Dec. 17, 2019, 8 pages.

\* cited by examiner

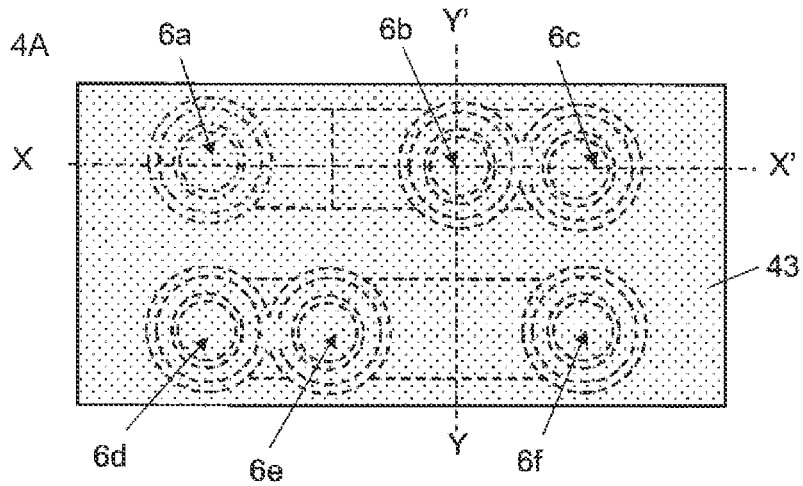
FIG. 4A
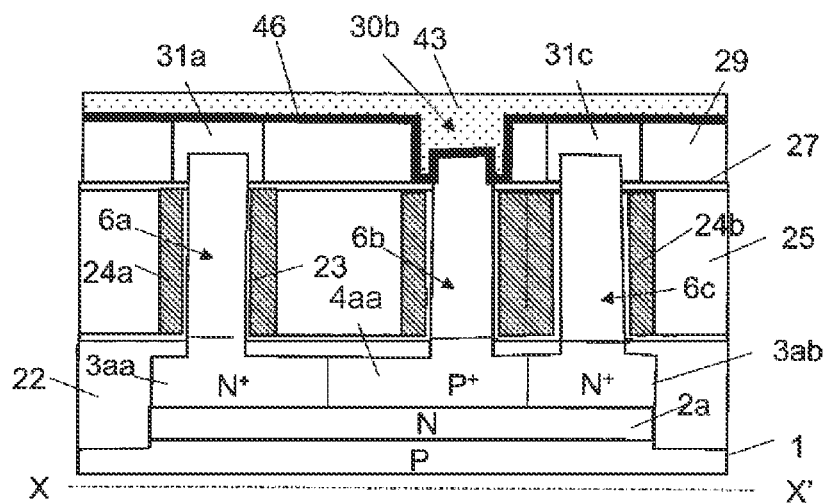
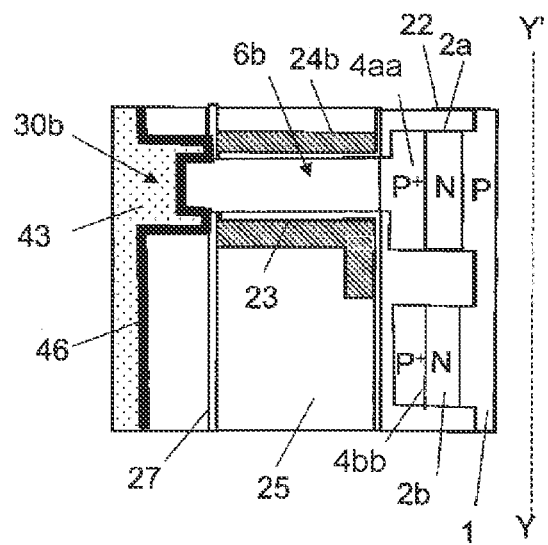
FIG. 4C

MANUFACTURING METHOD OF PILLAR-SHAPED SEMICONDUCTOR DEVICE

RELATED APPLICATIONS

The present application is a continuation application of PCT/JP2019/022366, filed Jun. 5, 2019, the entire contents of which are incorporated herein by reference.

BACKGROUND OF THE INVENTION

1. Field of the Invention

The present invention relates to a manufacturing method of a pillar-shaped semiconductor device.

2. Description of the Related Art

Recently, three-dimensional structure transistors are used for LSI (Large Scale Integration). Among them, SGT (Surrounding Gate Transistor), which is a pillar-shaped semiconductor device, has been attracting attention as a semiconductor element providing a highly integrated semiconductor device. In addition, higher integration and higher performance of semiconductor devices having SGTs are in need.

A conventional planar MOS transistor has channels extending in a horizontal direction along an upper surface of a semiconductor substrate. On the contrary, channels of the SGT extend in a direction vertical to an upper surface of a semiconductor substrate (refer for example to Laid-Open Japanese Patent Application Publication: JP H02-188966A and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, density of the semiconductor device in the SGT can be increased more than that of the planar MOS transistor.

FIG. 6 shows a schematic structural view of an N channel SGT. $N^+$ layers 121$a$, 121$b$ (hereinafter, a semiconductor region containing donor impurity at high concentration is referred as "$N^+$ layer") in which when one is source, the other is drain, are each formed upper and lower parts in a Si pillar 120 (hereinafter, a silicon semiconductor pillar is referred as "Si pillar") having a conductivity type of P-type or i-type (intrinsic type). A part of the Si pillar 120 between the $N^+$ layers 121$a$, 121$b$, which are the source and the drain, becomes a channel region 122. A gate insulating layer 123 is formed surrounding the channel region 122. A gate conductor layer 124 is formed surrounding the gate insulating layer 123. In the SGT, the $N^+$ layers 121$a$, 121$b$, which are the source and the drain, the channel region 122, the gate insulating layer 123, and the gate conductor layer 124 are together formed into a pillar. Thus, in planar view, a footprint of the SGT corresponds to a footprint of a single source or drain $N^+$ layer of the planar MOS transistor. Therefore, a circuit chip having the SGT allows for achieving further reduction in chip size compared to a circuit chip having the planar MOS transistor.

In addition, when achieving further reduction in the chip size, there is a problem that has to be overcome. An upper $N^+$ layer 121$b$ is formed on top of the Si pillar 120 by a semiconductor layer such as Si, SiGe containing single crystal donor impurities by selective epitaxial crystal growth method, for example. To lower resistance of the $N^+$ layer 121$b$, an insulating layer 122 is provided on the gate insulating layer 123 and the gate conductor layer 124, and the $N^+$ layer 121$b$ expanded over an upper surface of the insulating layer 122 is formed by the selective epitaxial crystal growth method. In this case, the $N^+$ layer 121$b$ is formed as expanding outside of periphery of the Si pillar 120, in planar view. Here, when a Si pillar forming another SGT is to be formed adjacent to the Si pillar 120, an $N^+$ layer of such SGT needs to be formed such that it does not contact the $N^+$ layer 121$b$. This presents a problem in further reduction in the chip size.

FIG. 7 shows a circuit diagram of an SRAM cell (Static Random Access Memory). The SRAM cell circuit includes two inverter circuits. One inverter circuit is configured from a P channel SGT_Pc1 as a loading transistor and an N channel SGT_Nc1 as a driving transistor. Another inverter circuit is configured from a P channel SGT_Pc2 as a loading transistor and an N-channel SGT_Nc2 as a driving transistor. A gate of the P channel SGT_Pc1 is connected to a gate of the N channel SGT_Nc1. A drain of the P channel SGT_Pc2 is connected to a drain of the N-channel SGT_Nc2. A gate of the P channel SGT_Pc2 is connected to a gate of the N channel SGT_Nc2. A drain of the P channel SGT_Pc1 is connected to a drain of the N channel SGT_Nc1.

As shown in FIG. 7, a source of the P channels SGT_Pc1, Pc2 is connected to a supply terminal Vdd. In addition, a source of the N channels SGT_Nc1, Nc2 is connected to a ground terminal Vss. Each of selective N channels SGT_SN1, SN2 is located at each side of two inverter circuits. Gates of the selective N channels SGT_SN1, SN2 are each connected to a word line terminal WLt. Source and drain of the selective N channel SGT_SN1 are connected to drains of N channel SGT_Nc1 and P channel SGT_Pc1, and a bit line terminal BLt. Source and drain of the selective N channel SGT_SN2 are connected to drains of N channel SGT_Nc2 and P channel SGT_Pc2 and a reverse bit line terminal BLRt. Thus, the circuit having the SRAM cell is configured from total of six SGTs consisting of two P channels SGT_Pc1, Pc2, and four N channels SGT_Nc1, Nc2, SN1, and SN2 (refer for example to U.S. Patent Application Publication 2010/0219483). In addition, a plurality of driving transistors can be connected in parallel to allow for increase in speed of the SRAM circuit. In general, SGTs configuring memory cells of the SRAM are respectively formed into different semiconductor pillars. High integration of SRAM cell circuit is facilitated by forming a plurality of SGTs in one cell area at high density. This is also applied to high integration in circuit formation using other SGTs.

SUMMARY OF THE INVENTION

High integration of a circuit using SGTs is in need.

A manufacturing method of a pillar-shaped semiconductor device according to an aspect of the present invention includes steps of:

in manufacturing, on a substrate, an SGT device having a first semiconductor pillar, a second semiconductor pillar adjacent to the first semiconductor pillar, a first gate insulating layer surrounding the first semiconductor pillar, a second gate insulating layer surrounding the second semiconductor pillar, a first gate conductor layer surrounding the first gate insulating layer, a second gate conductor layer surrounding the second gate insulating layer, a first impurity layer connected to a top of the first semiconductor pillar, a second impurity layer connected to a top of the second semiconductor pillar, a third impurity layer connected to a lower part of the first semiconductor pillar, a fourth impurity layer connected to a lower part of the second semiconductor pillar, a first SGT which channel is provided by the first semiconductor pillar between the first impurity layer and the third impurity layer, and a second SGT which channel is provided by the second semiconductor pillar between the second impurity layer and the fourth impurity layer;

forming a first insulating layer over the first gate conductor layer and the second gate conductor layer, surrounding each top of the first semiconductor pillar and the second semiconductor pillar, with its upper surface position lower than each upper surface position of the first semiconductor pillar and the second semiconductor pillar;

forming a first material layer surrounding the top of the first semiconductor pillar, and a second material layer surrounding the top of the second semiconductor pillar, spaced from each other, over the first insulating layer;

forming a second insulating layer over the first insulating layer, surrounding the first material layer and the second material layer;

removing the first material layer and the second material layer;

exposing each top of the first semiconductor pillar and the second semiconductor pillar, and making upper surface position of each exposed top lower than the upper surface position of the second insulating layer and higher than the first insulating layer; and forming the first impurity layer which is a single crystal layer containing donor or acceptor impurity atoms surrounding the top of the first semiconductor pillar, which upper surface position is the same as or lower than the upper surface position of the second insulating layer, and the second impurity layer which is a single crystal layer containing donor or acceptor impurity atoms surrounding the top of the second semiconductor pillar, which upper surface position is the same as or lower than the upper surface position of the second insulating layer;

wherein the step of exposing each top of the first semiconductor pillar and the second semiconductor pillar, and making upper surface position of each exposed top lower than the upper surface position of the second insulating layer and higher than the first insulating layer has steps of:

forming a third material layer on the first semiconductor pillar, having a shape the same as that of the first semiconductor pillar in planar view, and a fourth material layer on the second semiconductor pillar, having a shape the same as that of the second semiconductor pillar in planar view;

forming the first material layer surrounding a side surface of the top of the first semiconductor pillar and the third material layer, and forming the second material layer surrounding a side surface of the top of the second semiconductor layer and the fourth material layer; and removing the first material layer, the second material layer, the third material layer, and the fourth material layer after forming the second insulating layer; and wherein the first gate conductor layer and the second gate conductor layer are formed such that they contact at entire side surface of a region of the channel of the first semiconductor pillar and the channel of the second semiconductor pillar in a vertical direction.

It is desirable in the manufacturing method that the first impurity layer and the second impurity layer are formed by selective epitaxial crystal growth method.

It is desirable in the manufacturing method that the step of forming one or both of the first impurity layer and the second impurity layer has steps of: after the step of exposing one or both top/tops of the first semiconductor pillar and the second semiconductor pillar, and making upper surface position of each exposed top lower than the upper surface position of the second insulating layer and higher than the first insulating layer, forming a fifth impurity layer containing donor or acceptor on one or both top/tops of the first semiconductor pillar and the second semiconductor pillar, and on the second insulating layer; and planarizing the fifth impurity layer such that its upper surface position comes to the upper surface position of the second insulating layer.

It is desirable in the manufacturing method that the step of forming one or both of the first impurity layer and the second impurity layer has a step of: before forming the first impurity layer and the second impurity layer, forming a single crystal thin film semiconductor layer on each exposed top of the first semiconductor pillar and the second semiconductor pillar, on the exposed first insulating layer, and on a side surface of the second insulating layer facing each exposed top of the first semiconductor pillar and the second semiconductor pillar.

It is desirable in the manufacturing method that the step of forming one or both of the first impurity layer and the second impurity layer has a step of: subjecting each exposed top of the first semiconductor pillar and the second semiconductor pillar to an anisotropic etching.

It is desirable in the manufacturing method that the step of exposing each top of the first semiconductor pillar and the second semiconductor pillar, and making upper surface position of each exposed top lower than the upper surface position of the second insulating layer and higher than the first insulating layer has steps of: making each upper surface position of the first semiconductor pillar, the second semiconductor pillar, the second insulating layer, the first material layer, and the second material layer the same; oxidizing each top of the first semiconductor pillar and the second semiconductor pillar to form an oxidized layer which lower surface position is between each upper position of the second insulating layer, the first material layer, and the second material layer, and the upper surface position of the first insulating layer, in a vertical direction; and removing the oxidized layer.

It is desirable that the method includes a step of: forming a first conductor layer of a metal or alloy which upper surface position is the same as that of the second insulating layer on the first impurity layer, and a second conductor layer of a metal or alloy which upper surface position is the same as that of the second insulating layer on the second impurity layer.

It is desirable in the manufacturing method that the step of forming the first impurity layer and the second impurity layer which are the single crystal layers containing the donor or acceptor impurity atoms has steps of: forming a fifth impurity layer surrounding one or both top/tops of the first semiconductor pillar and the second semiconductor pillar, and extended over the second insulating layer by an epitaxial crystal growth method; and planarizing the fifth impurity layer such that its upper surface position becomes the same as or lower than the upper surface position of the second insulating layer.

It is desirable that the method includes a step of: subjecting each exposed top of the first semiconductor pillar and the second semiconductor pillar to an anisotropic etching before forming the first impurity layer and the second impurity layer.

It is desirable that in forming an SRAM (Static Random Access Memory) circuit in which one cell area is configured by a plurality of SGTs on the substrate, the method includes steps of:

forming a fifth material layer over a semiconductor layer formed on the substrate;

forming four or five band-like first mask material layers which are parallel to and separated from each other in a first direction in planar view over the fifth material layer in the cell area;

with two band-like second mask material layers, which are parallel to and separated from each other in a direction orthogonal to the first direction in planar view, being formed below or above the band-like first mask material layers, in the cell area;

forming a third mask material layer consisting of a part or all of the fifth material layer, the band-like first mask material layer, and the band-like second mask layer on a part where the band-like first mask material layer and the band-like second mask material layer are overlapped; and etching the semiconductor layer with the third mask material layer as a mask to form a first set of semiconductor pillars aligned on a first line, and a second set of semiconductor pillars aligned on a second line parallel to the first line;

wherein arrangement is made such that:

a third semiconductor pillar is present on one end on the first line in the first set of semiconductor pillars, a fourth semiconductor pillar is present on an end opposite to the one end on the second line in the second set of semiconductor pillars, and a fifth semiconductor pillar is present as having a center at a point where a first center line extending through a center of the third semiconductor pillar, orthogonal to the first line and the second line cross, a sixth semiconductor pillar is present as having a center at a point where a second center line extending through a center of the fourth semiconductor pillar, orthogonal to the second line and the first line cross, a seventh semiconductor pillar is present as having a center on the first line and being adjacent to the sixth semiconductor pillar, and an eighth semiconductor pillar is present as having a center on the second line and being adjacent to the fifth semiconductor pillar;

wherein, in planar view, a first semiconductor pillar-absent area having no semiconductor pillar of the first set of semiconductor pillars is present in, at least a part being overlapped on, a first band area, the first band area being an extension of insides of two tangential lines of periphery of the eighth semiconductor pillar, the two tangential lines being parallel to the first center line, and a second semiconductor pillar-absent area having no semiconductor pillar of the second set of semiconductor pillars is formed in, at least a part being overlapped on, a second band area, the second band area being an extension of insides of two tangential line of periphery of the seventh semiconductor pillar, the two tangential lines being parallel to the second center line;

wherein when one of the fifth semiconductor pillar and the eighth semiconductor pillar is the first semiconductor pillar, the other is the second semiconductor pillar, and similarly, when one of the sixth semiconductor pillar and the seventh semiconductor pillar is the first semiconductor pillar, the other is the second semiconductor pillar;

wherein a first contact hole connecting a first impurity region formed being linked to a bottom of the first set of semiconductor pillars, and the first gate conductor layer and the second gate conductor layer of the fifth semiconductor pillar and the eighth semiconductor pillar is formed on the first semiconductor pillar-absent area, and a second contact hole connecting a second impurity region formed being linked to a bottom of the second set of semiconductor pillars, and the first gate conductor layer and the second gate conductor layer of the sixth semiconductor pillar and the seventh semiconductor pillar is formed on the second semiconductor pillar-absent area; and wherein the first impurity region and the second impurity region both include the third impurity layer and the fourth impurity layer.

BRIEF DESCRIPTION OF THE DRAWINGS

FIG. 1OA and FIGS. 1OB and 1OC are respectively a plane view and cross-sectional structural views for describing a manufacturing method of a pillar-shaped semiconductor device having SGTs according to the first embodiment.

FIG. 4A and FIGS. 4B and 4C are respectively a plane view and cross-sectional structural views for describing a manufacturing method of a pillar-shaped semiconductor device having SGTs according to the fourth embodiment of the present invention.

DETAILED DESCRIPTION OF THE PREFERRED EMBODIMENTS

Hereinafter, the manufacturing method of a pillar-shaped semiconductor device according to embodiments of the present invention is described with reference to drawings.

First Embodiment

Hereinafter, a manufacturing method of an SRAM circuit having SGTs according to the first embodiment of the present invention is described with reference to FIGS. 1AA to 1QC. In the figures, figures suffixed with A are plane views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 1A:
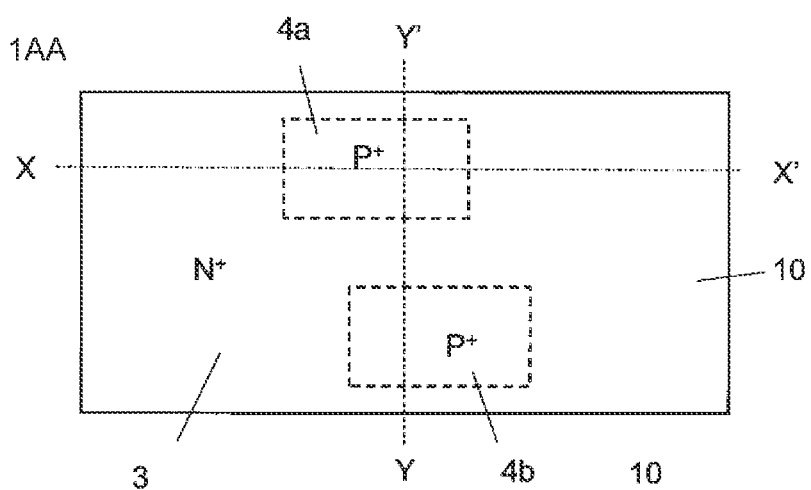
FIG. 1AA and FIGS. 1AB and 1AC are respectively a plane view and cross-sectional structural views for describing a manufacturing method of a pillar-shaped semiconductor device having SGTs according to the first embodiment.
Figure 1A:
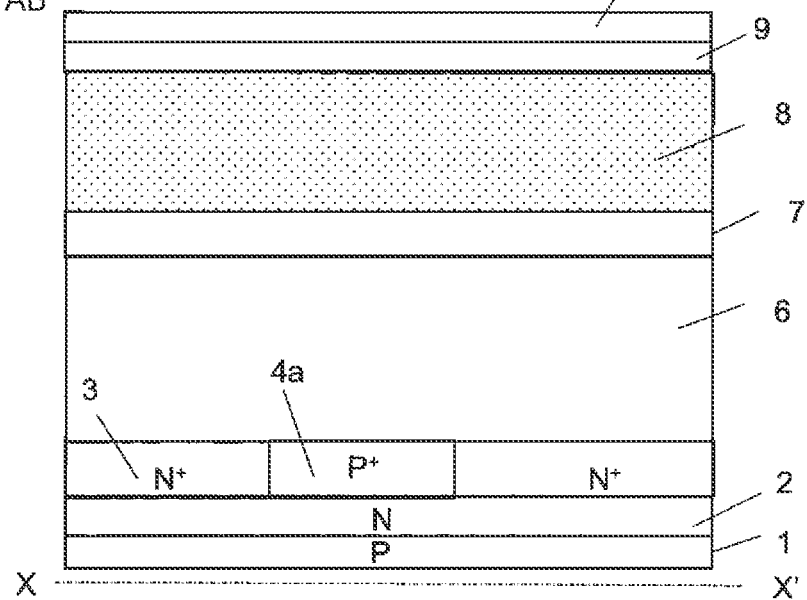
Figure 1A:
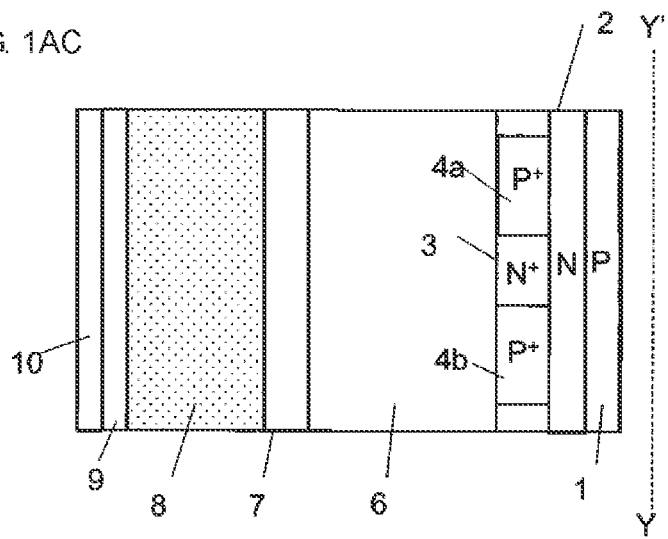

As shown in FIGS. 1AA to 1AC, an N layer 2 is formed on a P layer substrate 1 by an epitaxial crystal growth method. Then, an $N^+$ layer 3 and $P^+$ layers 4a, 4b are formed on a surface layer of the N layer 2 by an ion implantation method. Then, an i layer 6 is formed. Then, a mask material layer 7 consisting of, for example, a $SiO_2$ layer, an aluminum oxide ($Al_2O_3$, hereinafter referred as AlO) layer and a $SiO_2$ layer is formed. Then, a silicon germanium (SiGe) layer 8 is deposited. Then, a mask material layer 9 consisting of a $SiO_2$ layer is deposited. Then, a mask material layer 10 consisting of a SiN layer is deposited. The i layer 6 may also be formed by N-type or P-type Si which contains a small amount of donor or acceptor impurity.

Figure 1B:
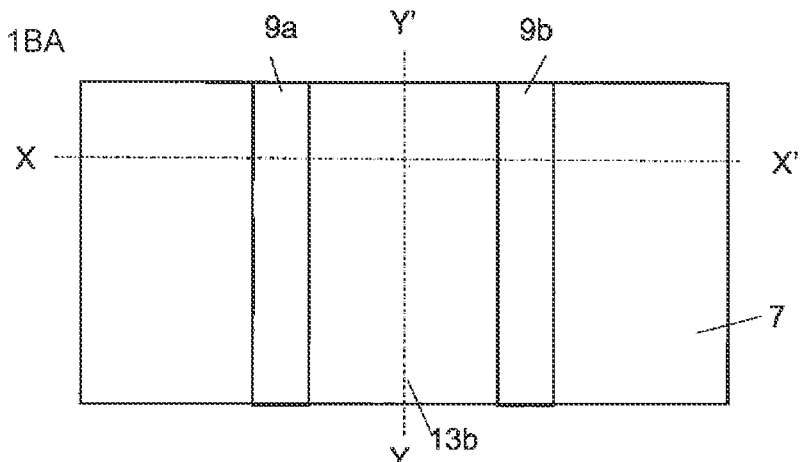
FIG. 1BA and FIGS. 1BB and 1BC are respectively a plane view and cross-sectional structural views for describing a manufacturing method of a pillar-shaped semiconductor device having SGTs according to the first embodiment.
Figure 1B:
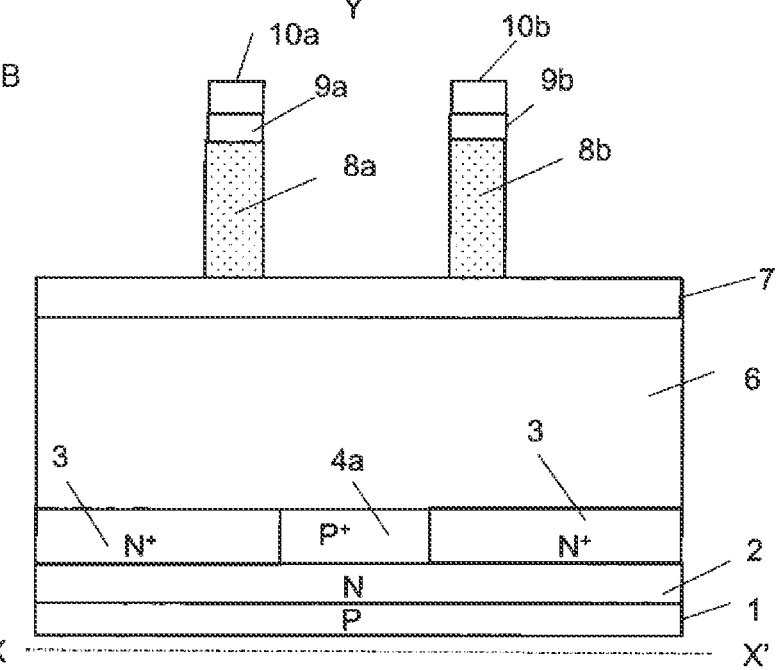
Figure 1B:
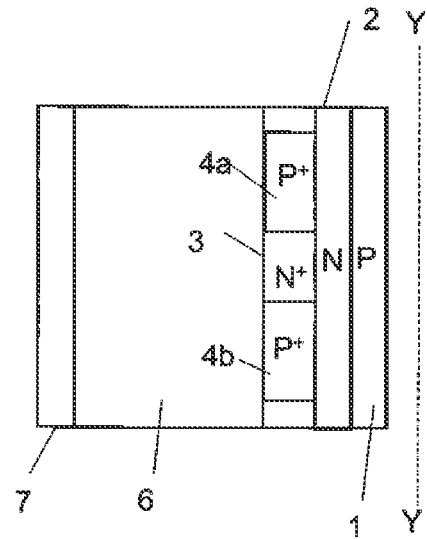

Next, the mask material layer 10 is etched with a lithographically formed band-like resist layer (not shown), extended in Y direction in planar view, as a mask. A band-like mask material layer (not shown) extended in the Y direction in planar view is thus formed. The band-like mask material layer is subjected to an isotropic etching with a resist layer as a mask such that the width of the band-like mask material layer is formed to become smaller than the width of the resist layer. Thus, it may be possible to form band-like mask material layers 10a, 10b having a width smaller than the smallest width of a resist layer which can be formed lithographically. Then, the mask material layer 9 is etched, for example by RIE (Reactive Ion Etching), with the band-like mask material layers 10a, 10b as an etching mask, to form a band-like mask material layers 9a, 9b. While the band-like mask material layers 10a, 10b formed by the isotropic etching has a trapezoidal cross section with its bottom width being wider than its top width, the band-like mask material layers 9a, 9b is etched by RIE, and thus has a rectangular cross section. This rectangular cross section leads an enhanced precision of etching pattern, etched with the band-like mask material layers 9a, 9b as a mask. Next, the SiGe layer 8 is etched, for example by RIE method with the band-like mask material layers 9a, 9b as a mask, to form band-like SiGe layers 8a, 8b as shown in FIGS. 1BA to 1BC. The band-like mask material layers 10a, 10b on the band-like mask material layers 9a, 9b may be removed prior to the etching of the SiGe layer 8, or may remain.

Figure 1C:
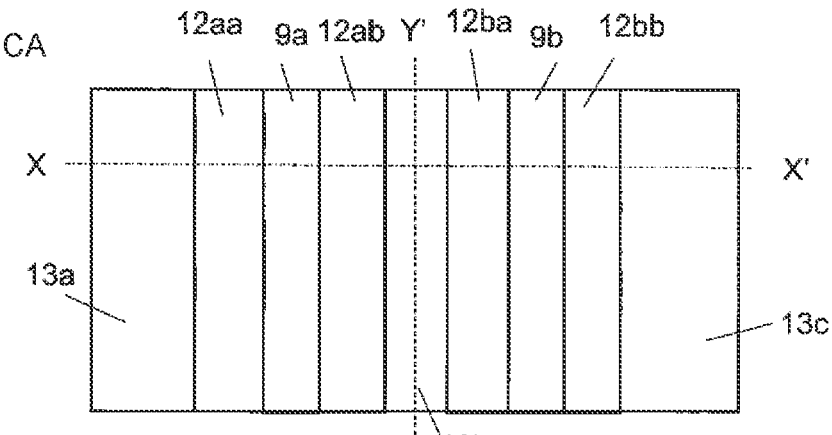
FIG. 1CA and FIGS. 1CB and 1CC are respectively a plane view and cross-sectional structural views for describing a manufacturing method of a pillar-shaped semiconductor device having SGTs according to the first embodiment.
Figure 1C:
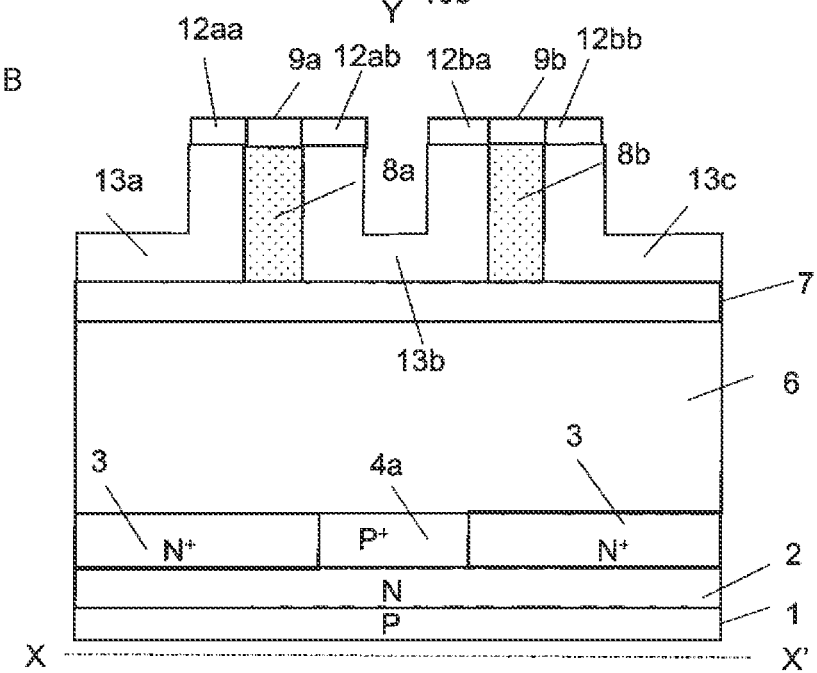
Figure 1C:
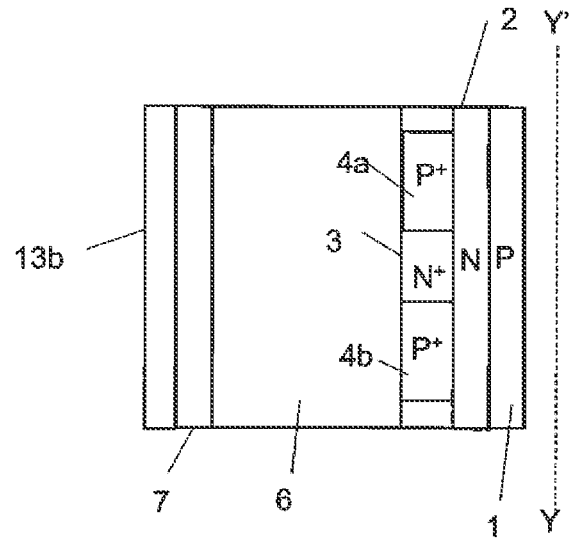

Next, a SiN layer (not shown) is entirely formed over the mask material layer 7, the band-like SiGe layers 8a, 8b, and the band-like mask material layers 9a, 9b by ALD (Atomic Layered Deposition) method. In this case, a cross section of the SiN layer 12 provides a round part at its top. It is desirable to form the round part to be positioned above the band-like mask material layers 9a, 9b. Then, the entire area is covered by a SiO$_2$ layer (not shown) for example by flow CVD (Flow Chemical Vapor Deposition) method, and then the SiO$_2$ layers and the SiN layer are polished by CMP (Chemical Mechanical Polishing) such that their upper surface position comes to the upper surface position of the band-like mask material layers 9a, 9b to form SiN layers 13a, 13b, 13c. Then, each of the top of the SiN layers 13a, 13b, 13c are etched to form recesses. The recesses are formed such that their bottom positions come to the lower positions of the band-like mask material layers 9a, 9b. Then, the entire area is covered by a SiN layer (not shown), and the entire SiN layer is polished by CMP method such that its upper surface position comes to the upper surface position of the mask material layers 9a, 9b. Then, the SiO$_2$ layer formed by flow CVD method is removed. Thus, as shown in FIGS. 1CA to 1CC, band-like mask material layers 12aa, 12ab, 12ba, 12bb having shapes same as the shapes of the top of the SiN layers 13a, 13b, 13c in planar view are formed on each side of the band-like mask material layer 9a, 9b.

Figure 1D:
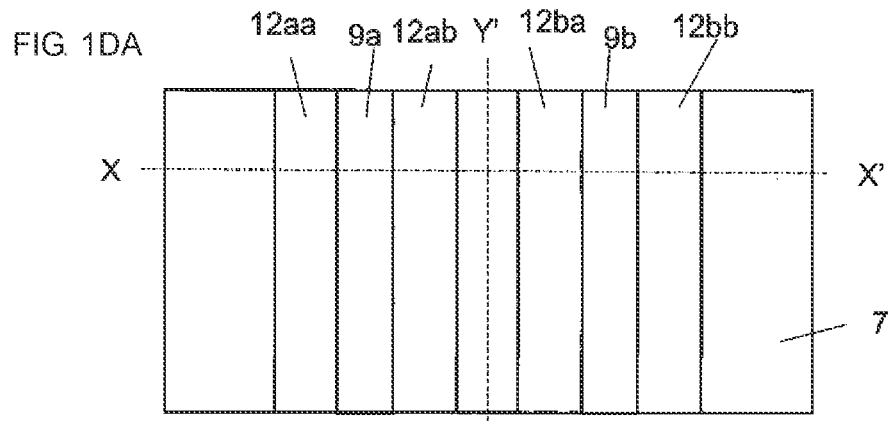
FIG. 1DA and FIGS. 1DB and 1DC are respectively a plane view and cross-sectional structural views for describing a manufacturing method of a pillar-shaped semiconductor device having SGTs according to the first embodiment.
Figure 1D:
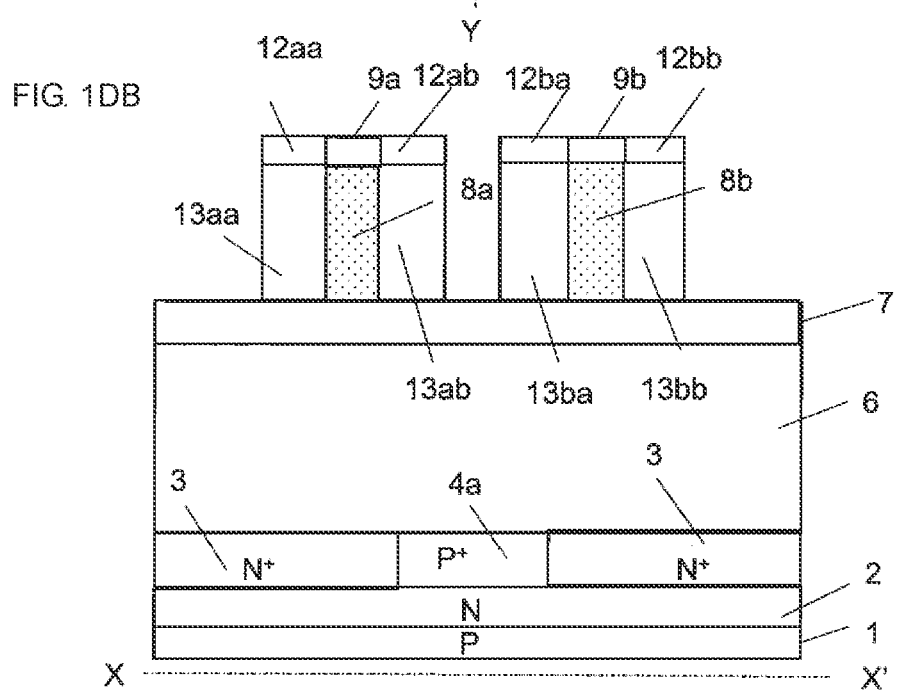
Figure 1D:
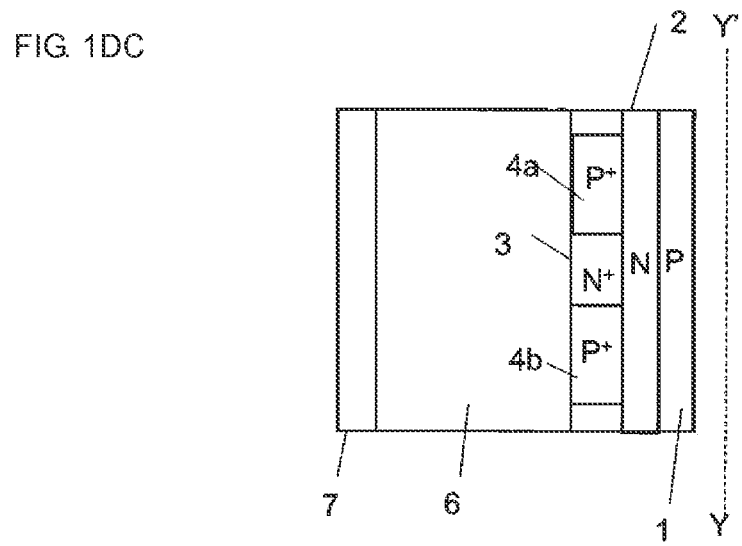

Next, as shown in FIGS. 1DA to 1DC, the SiN layers 13a, 13b, 13c are etched with the band-like mask material layers 9a, 9b, 12aa, 12ab, 12ba, 12bb as a mask to form band-like SiN layers 13aa, 13ab, 13ba, 13bb. In this case, the band-like SiN layers 13aa, 13ab, 13ba, 13bb have the same width in planar view.

Figure 1E:
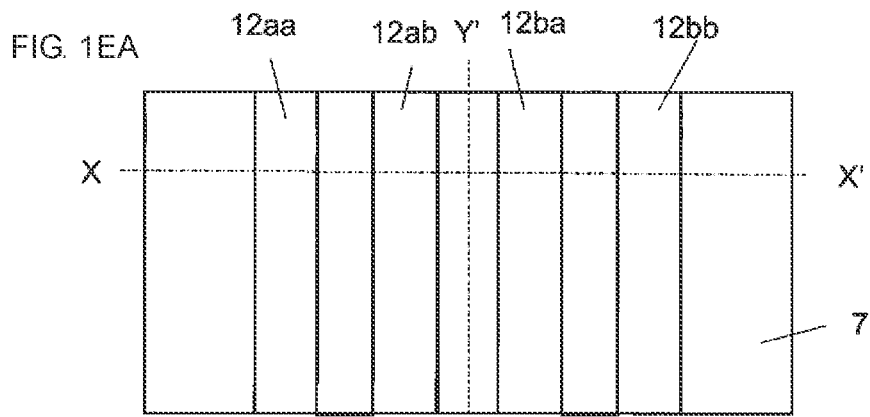
FIG. 1EA and FIGS. 1EB and 1EC are respectively a plane view and cross-sectional structural views for describing a manufacturing method of a pillar-shaped semiconductor device having SGTs according to the first embodiment.
Figure 1E:
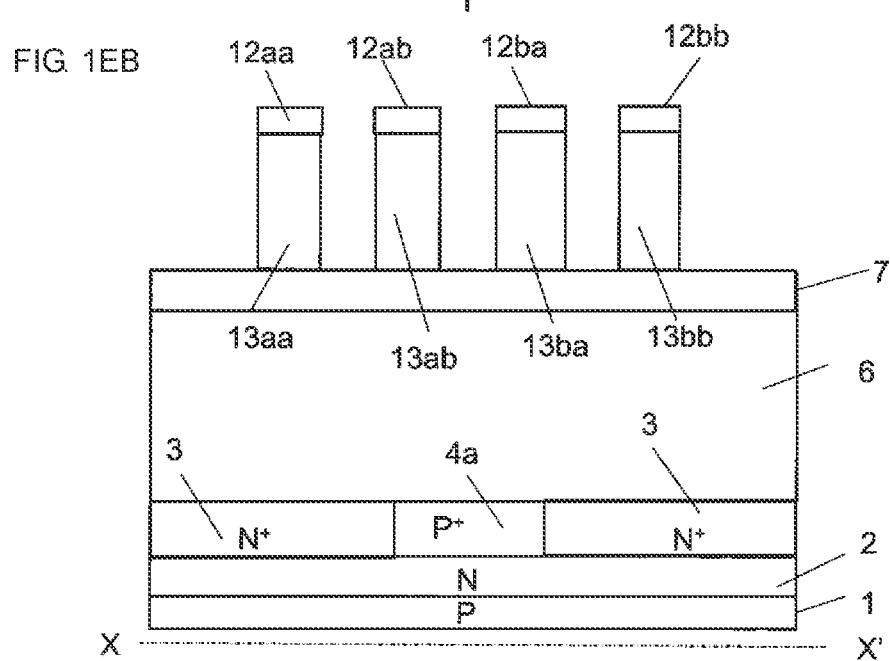
Figure 1E:
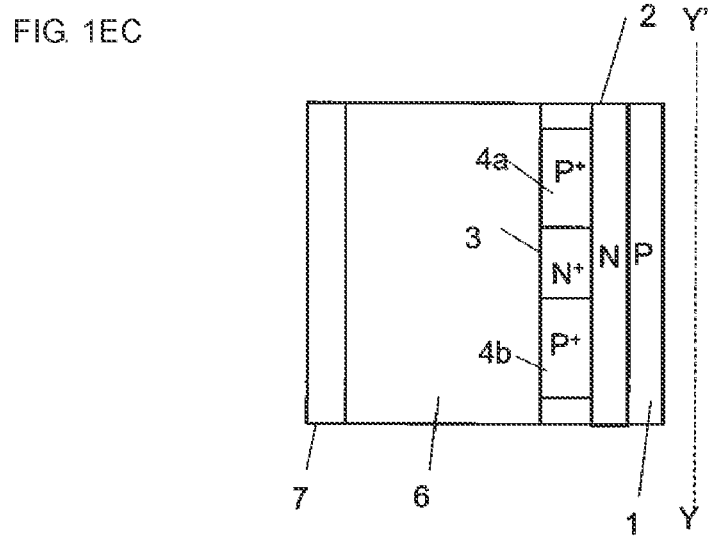

Next, the band-like mask material layers 9a, 9b and the band-like SiGe layers 8a, 8b are removed. Thus, as shown in FIGS. 1EA to 1EC, band-like SiN layers 13aa, 13ab, 13ba, 13bb having band-like mask material layers 12aa, 12ab, 12ba, 12bb on their top, extended in Y direction and aligned in parallel each other in planar view, are formed on the mask material layer 7.

Figure 1F:
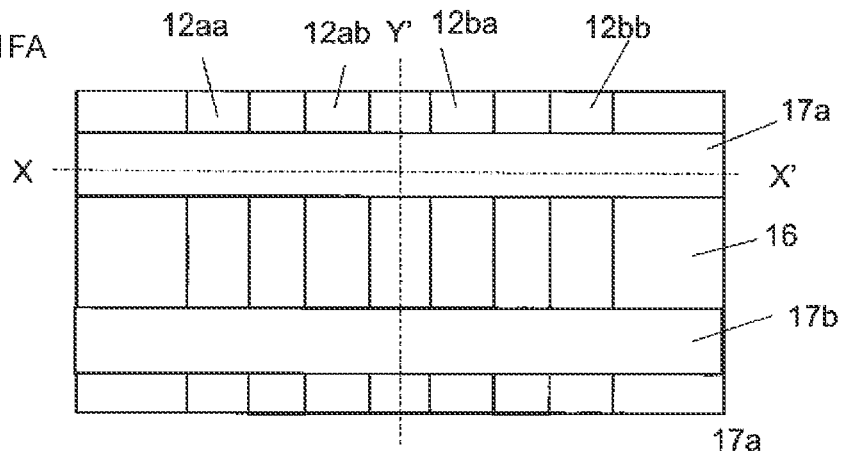
FIG. 1FA and FIGS. 1FB and 1FC are respectively a plane view and cross-sectional structural views for describing a manufacturing method of a pillar-shaped semiconductor device having SGTs according to the first embodiment.
Figure 1F:
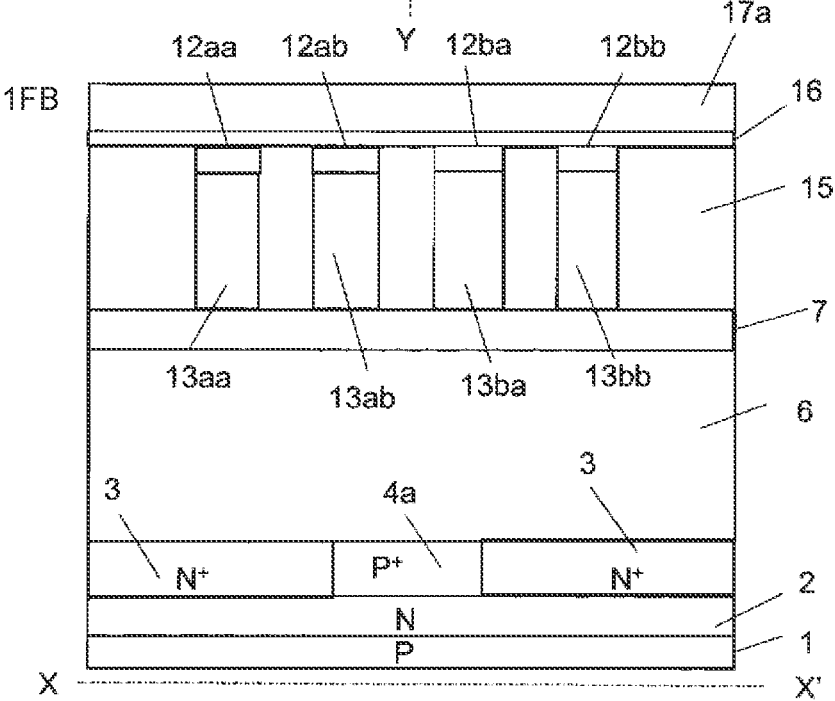
Figure 1F:
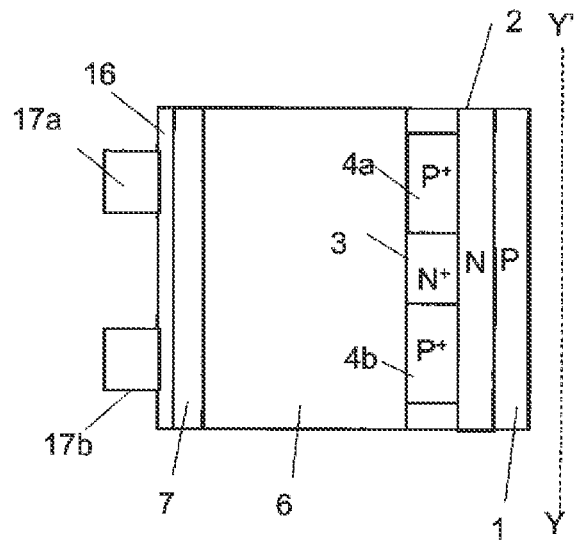

Next, a SiO$_2$ layer (not shown) covering the entire area is formed by FCVD method. Then, the SiO$_2$ layer is polished by CMP method such that its upper surface position becomes the same as the upper surface position of the band-like mask material layers 12aa, 12ab, 12ba, 12bb to form a SiO$_2$ layer 15 as shown in FIGS. 1FA to 1FC. Then, a SiN layer 16 is formed on the SiO$_2$ layer 15 and the band-like mask material layers 12aa, 12ab, 12ba, 12bb. Then, band-like mask material layers 17a, 17b, extended in X direction and aligned in parallel each other, are formed on the SiN layer 16 by using a basic method same as the method for forming the band-like SiN layers 13aa, 13ab, 13ba, 13bb.

Figure 1G:
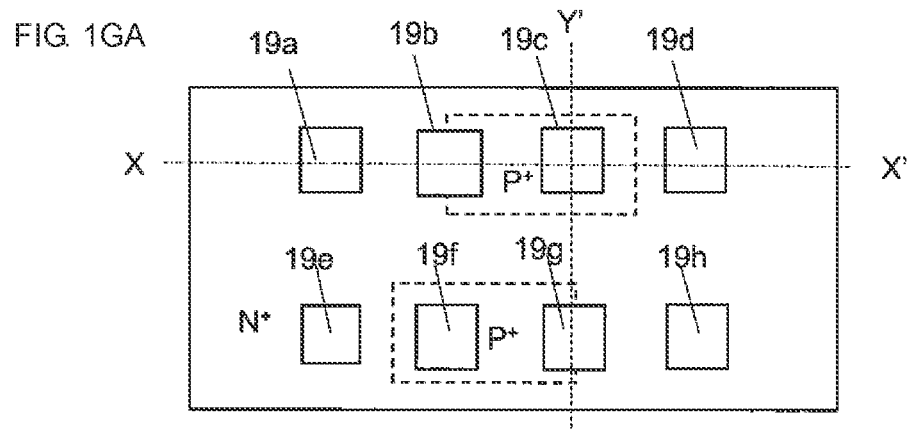
FIG. 1GA and FIGS. 1GB and 1GC are respectively a plane view and cross-sectional structural views for describing a manufacturing method of a pillar-shaped semiconductor device having SGTs according to the first embodiment.
Figure 1G:
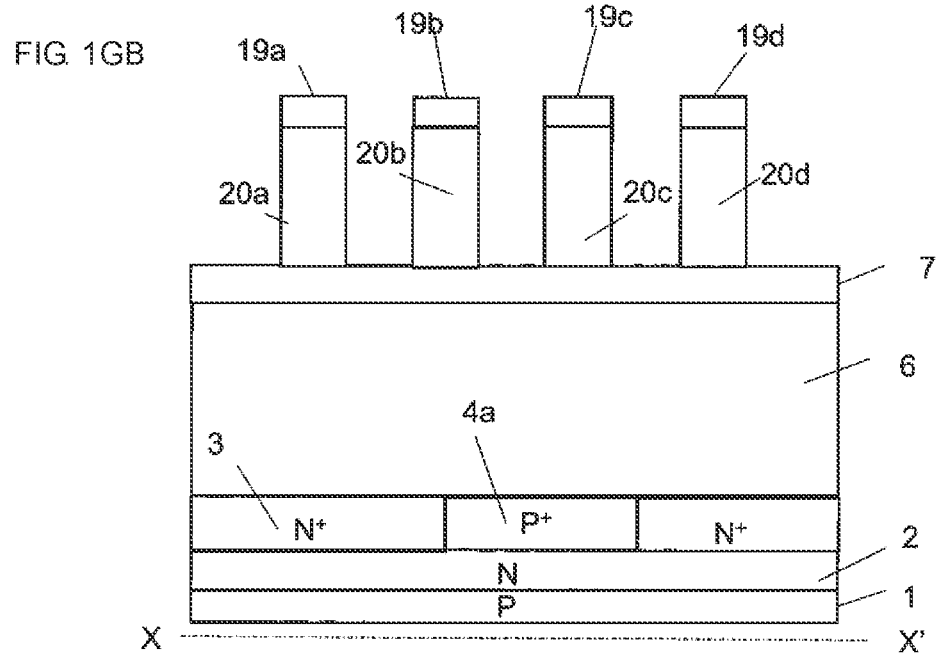
Figure 1G:
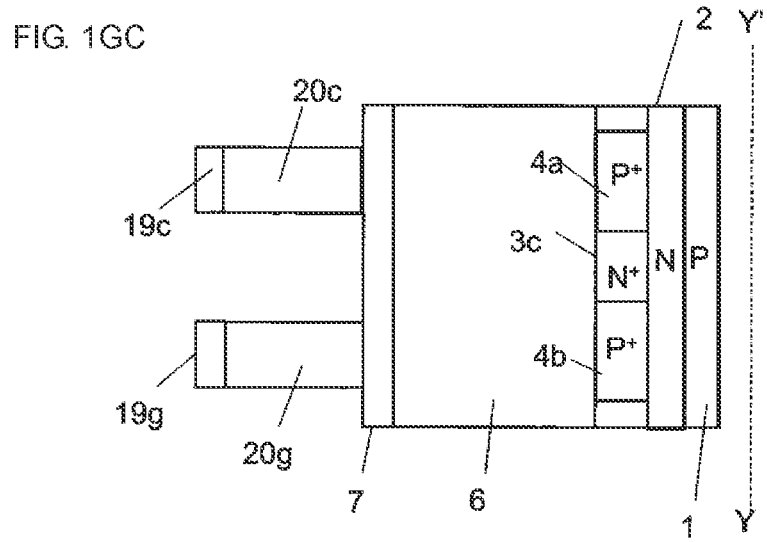

Then, as shown in FIGS. 1GA to 1GC, the SiN layer 16, the band-like mask material layers 12aa, 12ab, 12ba, 12bb, the band-like SiN layers 13aa, 13ab, 13ba, 13bb, and the mask material layer 7 are subjected to RIE etching with the band-like mask material layers 17a, 17b as a mask. Then, the remaining SiN layer 16 and SiO$_2$ layer 15 are removed. Thus, SiN pillars 20a, 20b, 20c, 20d, 20e, 20f, 20g, 20h having, in planar view, rectangular-shaped mask material layers 19a, 19b, 19c, 19d, 19e, 19f, 19g, 19h on their top are formed.

Figure 1H:
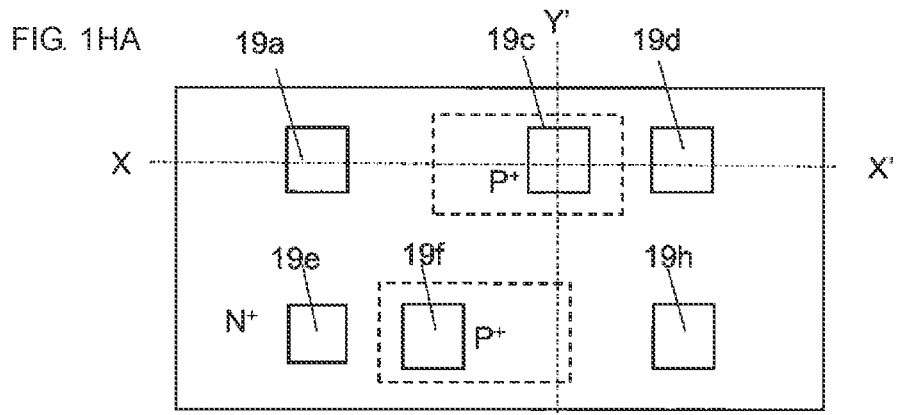
FIG. 1HA and FIGS. 1HB and 1HC are respectively a plane view and cross-sectional structural views for describing a manufacturing method of a pillar-shaped semiconductor device having SGTs according to the first embodiment.
Figure 1H:
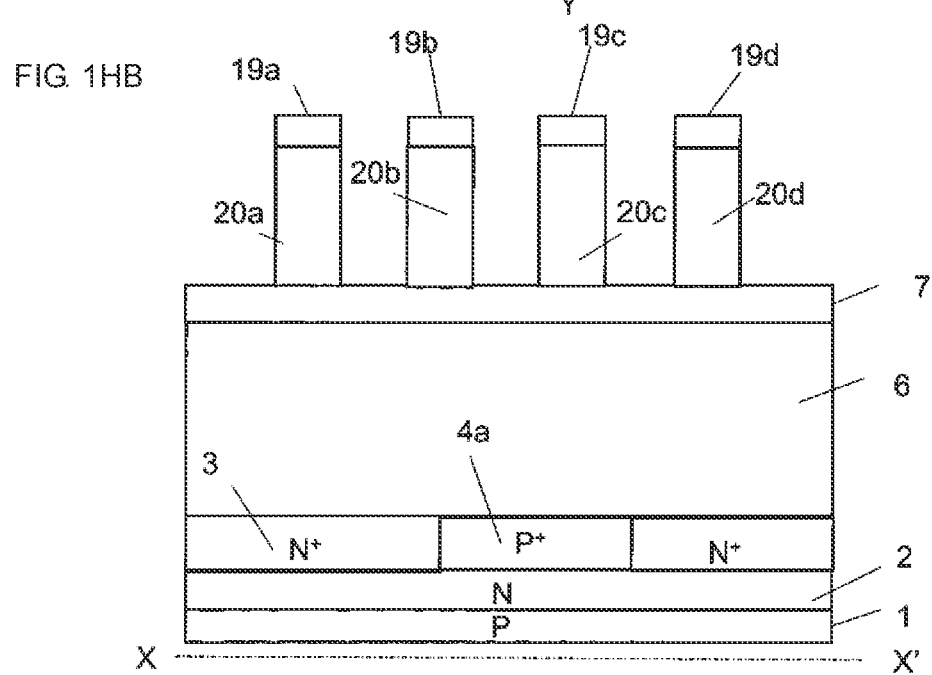
Figure 1H:
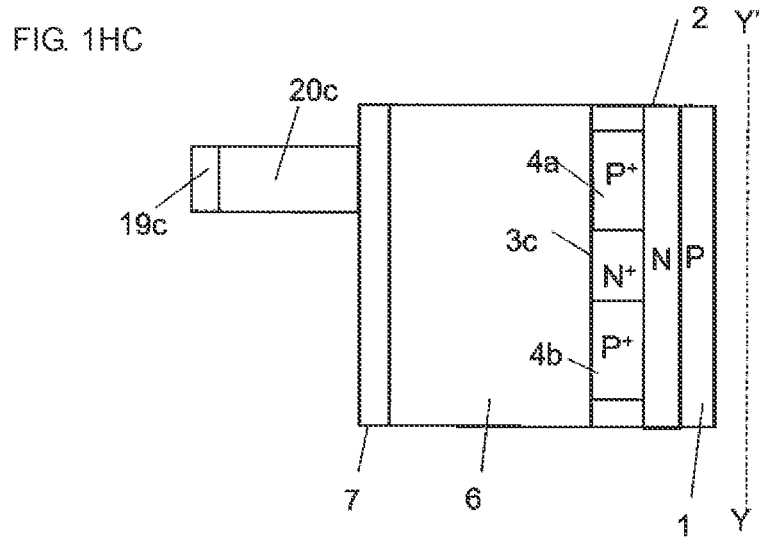

Next, as shown in FIGS. 1HA to 1HC, the rectangular-shaped mask material layers 19b, 19g and the SiN pillars 20b, 20g are removed.

Figure 1I:
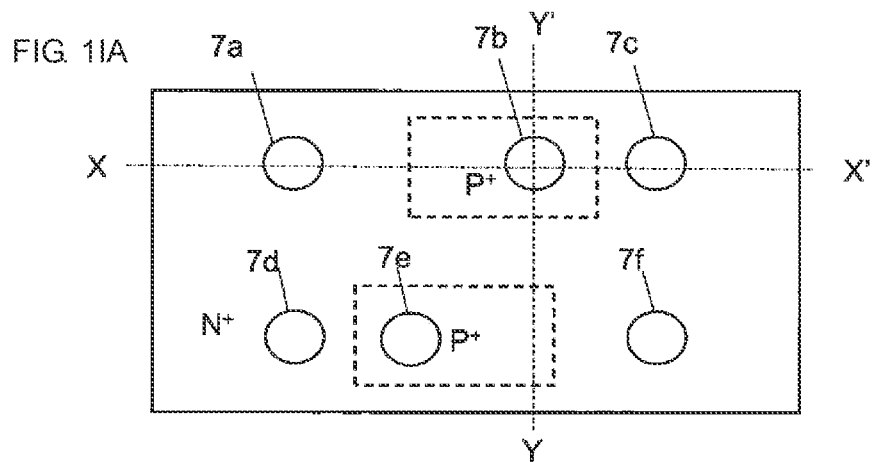
FIG. 1IA and FIGS. 1IB and 1IC are respectively a plane view and cross-sectional structural views for describing a manufacturing method of a pillar-shaped semiconductor device having SGTs according to the first embodiment.
Figure 1I:
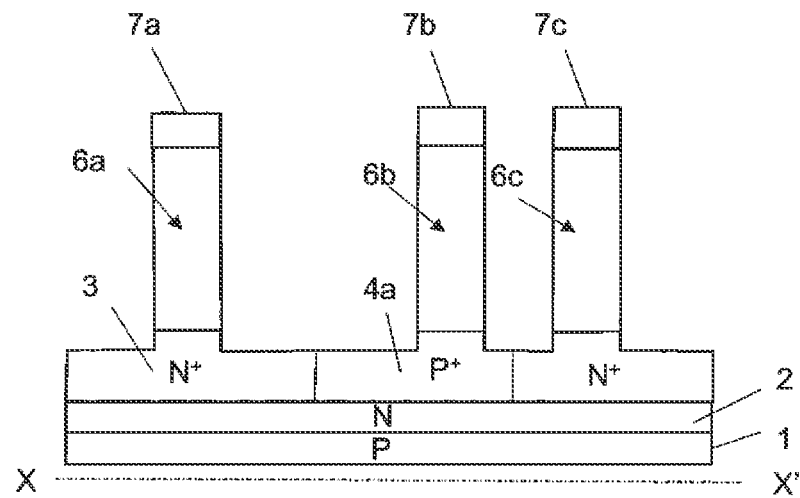
Figure 1I:
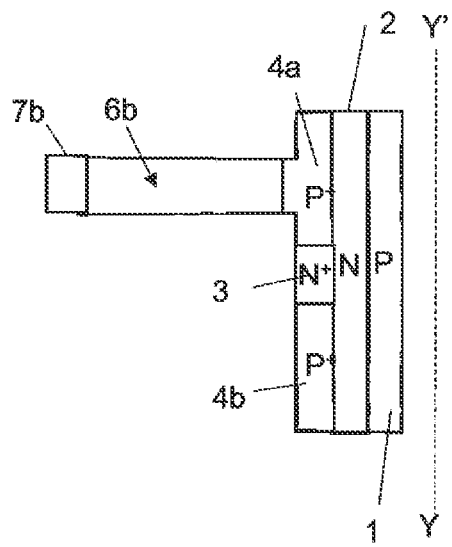

Next, the mask material layer 7 is etched with the mask material layers 19a, 19c, 19d, 19e, 19f, 19h and the SiN pillars 20a, 20c, 20d, 20e, 20f, 20h as a mask to form mask material layers 7a, 7b, 7c, 7d, 7e, 7f. In the etching, mask material layers 7a, 7b (one of the third material layer and the fourth material layer), 7c (the fourth material layer when the mask material layer 7b is the third material layer, and the third material layer when the mask material layer 7b is the fourth material layer), 7d (one of the third material layer and the fourth material layer), 7e (the fourth material layer when the mask material layer 7d is the third material layer, and the third material layer when the mask material layer 7d is the fourth material layer), and 7f are made to be circular shape in planar view, by performing isotropic etching for example by CDE (Chemical Dry Etching) method. The CDE etching may not be necessary, when the shape of the mask material layers 7a, 7b, 7c, 7d, 7e, 7f in planar view is circular prior to the process. Then, the mask material layers 19a, 19c, 19d, 19e, 19f, 19h and the SiN pillars 20a, 20c, 20d, 20e, 20f, 20h are removed. Then, the i layer 6 is etched with the mask material layers 7a, 7b, 7c, 7d, 7e, 7f as a mask to form Si pillars 6a, 6b, 6c, 6d, 6e, 6f on the N$^+$ layer 3 and the P$^+$ layers 4a, 4b, as shown in FIGS. 1IA to 1IC. The mask material layers 7a, 7b, 7c, 7d, 7e, 7f may be such layers in which the upper layer of the mask material layer 7 in vertical direction has been removed. In order to obtain mask material layers 7a, 7b, 7c, 7d, 7e, 7f with precision, material configuration for the mask material layer 7 is selected.

Figure 1J:
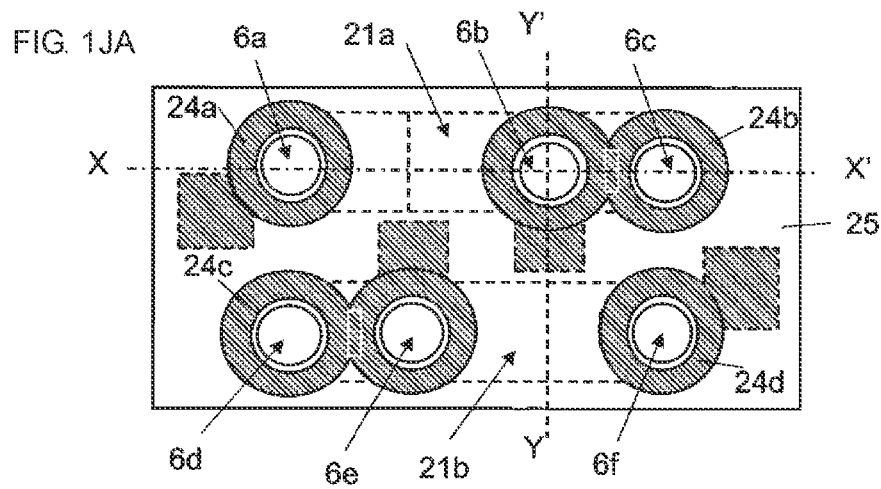
FIG. 1JA and FIGS. 1JB and 1JC are respectively a plane view and cross-sectional structural views for describing a manufacturing method of a pillar-shaped semiconductor device having SGTs according to the first embodiment.
Figure 1J:
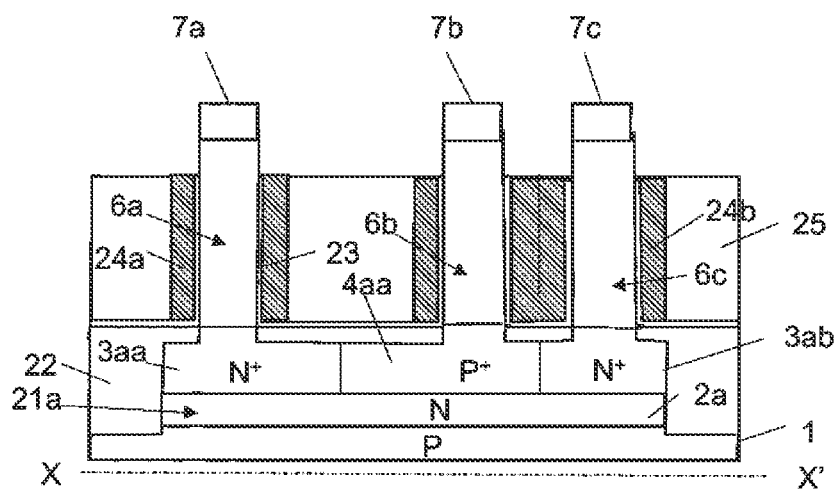
Figure 1J:
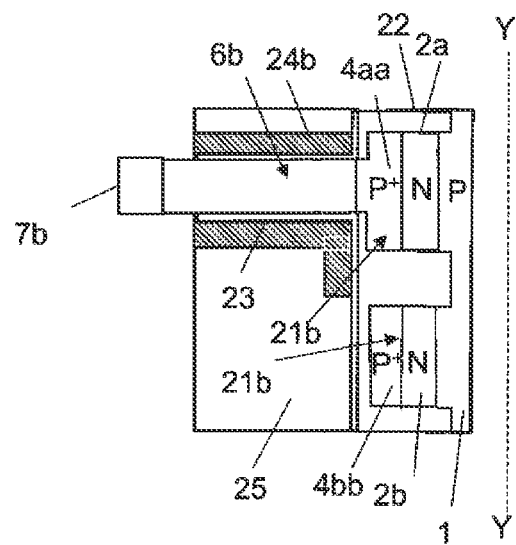

Next, as shown in FIGS. 1JA to 1JC, the N$^+$ layer 3, the P$^+$ layer 4a, the N layer 2, and the P layer substrate 1 linked to the bottom of the Si pillars 6a, 6b, 6c are etched to form a Si pillar base 21a consisting of a top part of the P layer substrate 1, an N layer 2a, N$^+$ layers 3aa, 3ab (one of the third impurity layer and the fourth impurity layer), and a P$^+$ layer 4aa (the fourth impurity layer when the N$^+$ layer 3ab is the third impurity layer, and the third impurity layer when the N$^+$ layer 3ab is the fourth impurity layer). At the same time, the N$^+$ layer 3, the P$^+$ layer 4b, the N layer 2, and the P layer substrate 1 linked to the bottom of the Si pillars 6d, 6e, 6f are etched to form a Si pillar base 21b consisting of a top part of the P layer substrate 1, an N layer 2b, N$^+$ layers 3ba (not shown, one of the third impurity layer and the fourth impurity layer), 3bb (not shown), and a P$^+$ layer 4bb (the fourth impurity layer when the N$^+$ layer 3ba is the third impurity layer, and the third impurity layer when the N$^+$ layer 3ba is the fourth impurity layer). Then, a SiO$_2$ layer 22 is formed on the periphery of the N$^+$ layers 3aa, 3ab, 3ba, 3bb, N layers 2a, 2b and the P$^+$ layers 4aa, 4bb, and on the P layer substrate 1. Then, a HfO$_2$ layer 23 and a TiN layer (not shown) are formed by ALD method over the entire area. In this case, the TiN layer contacts at side surfaces between the Si pillars 6b and 6c and between the Si pillars 6d and 6e. Then, a TiN layer 24a surrounding the HfO$_2$ layer 23 formed on the periphery of the Si pillar 6a, a TiN layer 24b surrounding the HfO$_2$ layer 23 formed on the periphery of the Si pillars 6b, 6c, a TiN layer 24c surrounding the HfO$_2$ layer 23 formed on the periphery of the Si pillars 6d, 6e, and a TiN layer 24d surrounding the HfO$_2$ layer 23 formed on the periphery of the Si pillar 6f are formed. Then, the entire area is covered by a SiO$_2$ layer (not shown), and then it is polished by CMP method such that its upper surface position comes to the upper surface position of the mask material layers 7a, 7b, 7c, 7d, 7e, 7f. Then, the planarized SiO$_2$ layer (not shown) planarized by RIE method is etched back to form a SiO$_2$ layer 25. Then, top portions of the HfO$_2$ layer 23 and the TiN layers 24a, 24b, 24c, 24d are removed with the mask material layers 7a, 7b, 7c, 7d, 7e, 7f and the SiO$_2$ layer 25 as a mask. The TiN layers 24a, 24b (first gate conductor layer and second gate conductor layer), 24c (first gate conductor layer and second gate conductor layer), and 24d become gate conductor layers of SGTs. The gate conductor layers are layers contributing to setting of a threshold voltage of the SGTs and may be formed of a gate conductor material layer consisting of a single layer or multiple layers.

The gate conductor material layers (first gate conductor layer and second gate conductor layer) are formed in contact with entire side surfaces between the Si pillars 6b and 6c and between the Si pillars 6d and 6e. Also, tungsten (W) layer, for example, may be formed to link to the gate conductor material layer, and the W layer may be used as a line conductor layer. The W layer may be other conductor material layers.

Figure 1K:
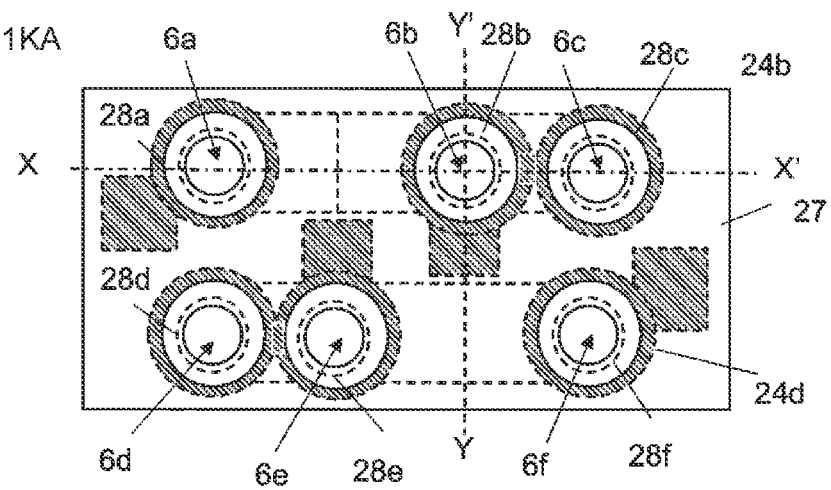
FIG. 1KA and FIGS. 1KB and 1KC are respectively a plane view and cross-sectional structural views for describing a manufacturing method of a pillar-shaped semiconductor device having SGTs according to the first embodiment.
Figure 1K:
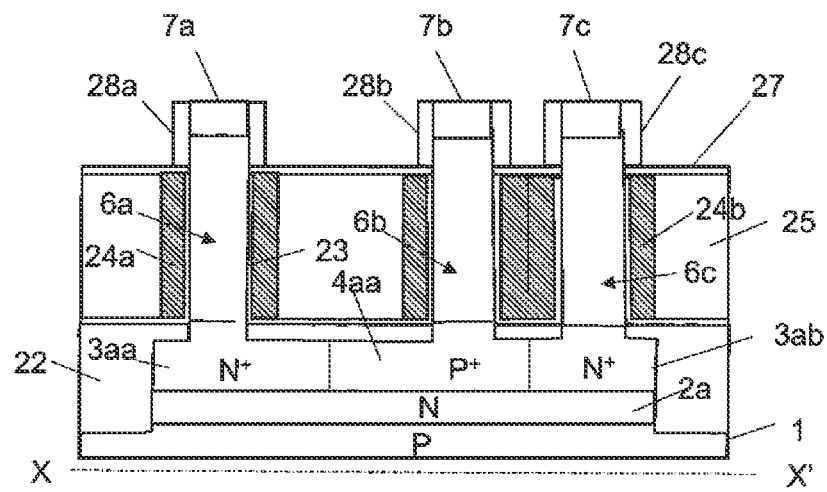
Figure 1K:
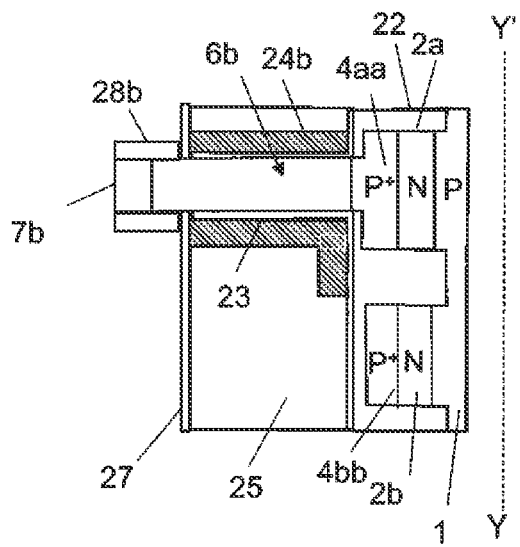

Next, as shown in FIGS. 1KA to 1KC, a SiN layer 27 (first insulating layer) is formed on the periphery of the Si pillars 6a to 6f and on the SiO₂ layer 25. Then, the entire area is covered by a SiO₂ layer (not shown). Then, the SiO₂ layer is etched by RIE method to form SiO₂ layers 28a, 28b, 28c, 28d, 28e, 28f having equal width in planar view, on side surfaces of exposed top parts of the Si pillars 6a to 6f and the mask material layers 7a to 7f. In this case, the SiO₂ layer 28b (first material layer) and the SiO₂ layer 28c (second material layer) are formed to be separate. Similarly, the SiO₂ layer 28d (first material layer) and the SiO₂ layer 28e (second material layer) are formed to be separate. The SiO₂ layers 28a, 28b, 28c, 28d, 28e, 28f are formed in self-aligning manner to the top parts of the Si pillars 6a to 6f. The self-aligning means that the positional relationship between the SiO₂ layers 28a, 28b, 28c, 28d, 28e, 28f and the top parts of the Si pillars 6a to 6f is formed without misalignment of mask as in a lithography method. Here, it may be sufficient that the SiN layer 27 exists at least on the TiN layers 24a, 24b, 24c, 24d. For example, instead of forming the SiN layer 27, the top parts of the TiN layers 24a, 24b may be oxidized to form oxide film. Also, the top parts of the TiN layers 24a, 24b may be etched and then insulating layer may be embedded into the etched portion. Also, instead of forming the SiN layer 27 (first insulating layer), the entire area is covered with a SiO₂ layer by ALD method, and then subjected to ion implantation with NO⁺ ion to modify the surface layer of the SiO₂ layer into SiN. The insulating layer may also be formed by other materials.

Figure 1L:
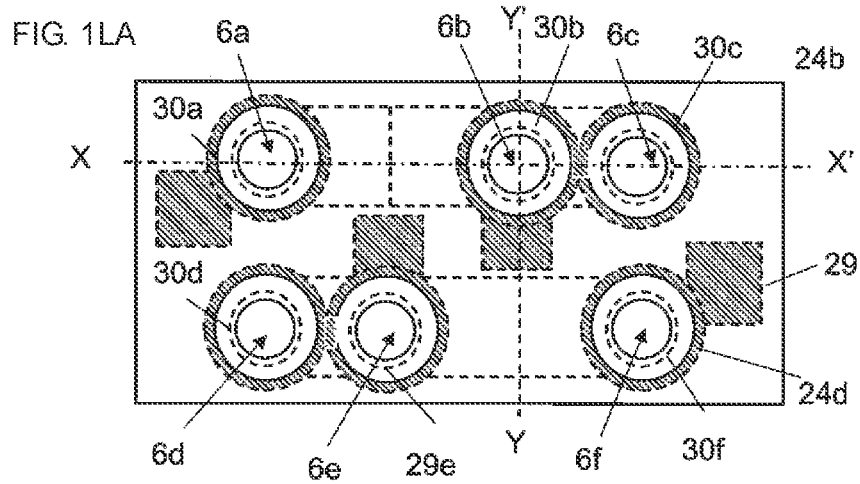
FIG. 1LA and FIGS. 1LB and 1LC are respectively a plane view and cross-sectional structural views for describing a manufacturing method of a pillar-shaped semiconductor device having SGTs according to the first embodiment.
Figure 1L:
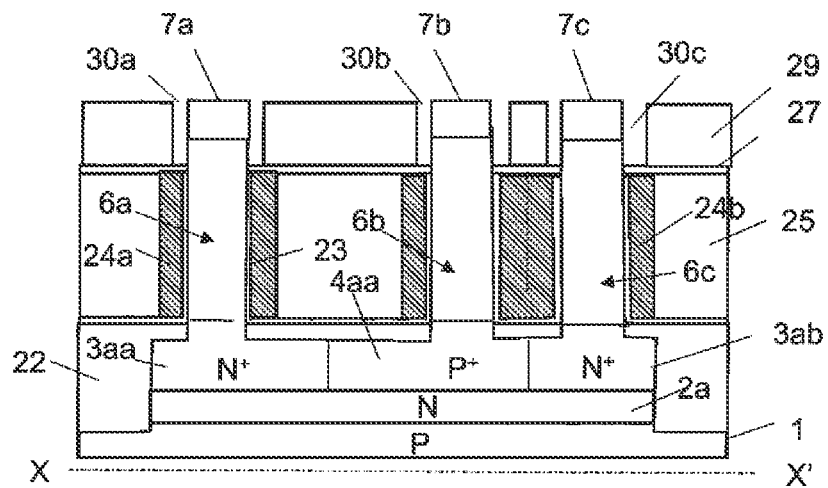
Figure 1L:
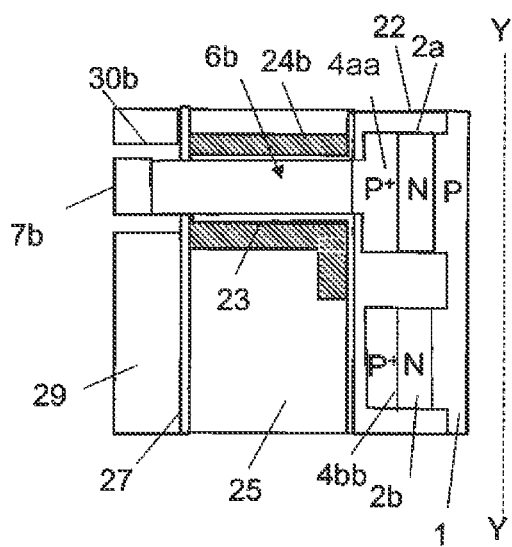

Next, the entire area is covered with a SiN layer (not shown). Then, as shown in FIGS. 1LA to 1LC, the SiN layer is polished by CMP method such that its upper surface position comes to the upper surface positions of the mask material layers 7a to 7f to form a SiN layer 29 (second insulating layer). Then, SiO₂ layers 28a, 28b, 28c, 28d, 28e, 28f surrounding top parts of the Si pillars 6a to 6f are removed to form recesses 30a, 30b, 30c, 30d, 30e, 30f surrounding the top parts of the Si pillars 6a to 6f. Since the SiO₂ layers 28a, 28b, 28c, 28d, 28e, 28f are formed in self-aligning manner to the top parts of the Si pillars 6a to 6f, the recesses 30a, 30b, 30c, 30d, 30e, 30f are also formed in self-aligning manner to the top parts of the Si pillars 6a to 6f.

Figure 1M:
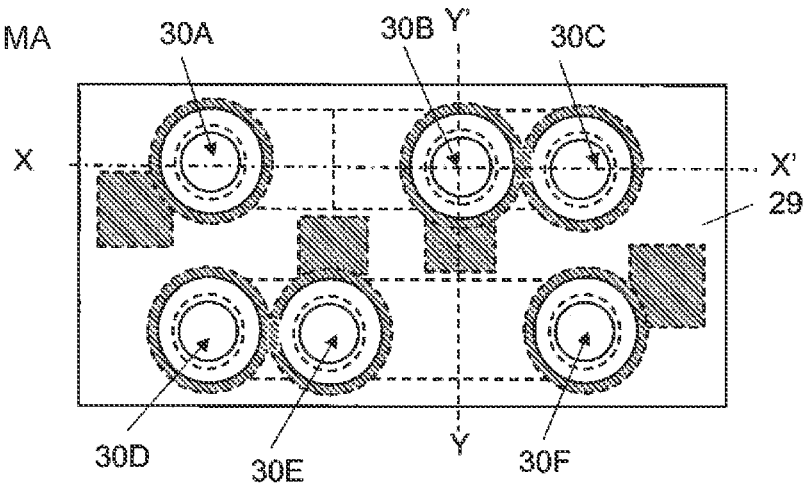
FIG. 1MA and FIGS. 1MB and 1MC are respectively a plane view and cross-sectional structural views for describing a manufacturing method of a pillar-shaped semiconductor device having SGTs according to the first embodiment.
Figure 1M:
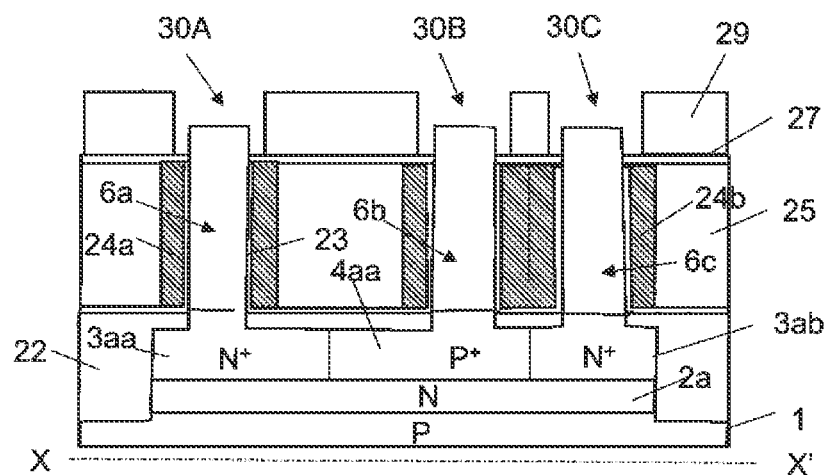
Figure 1M:
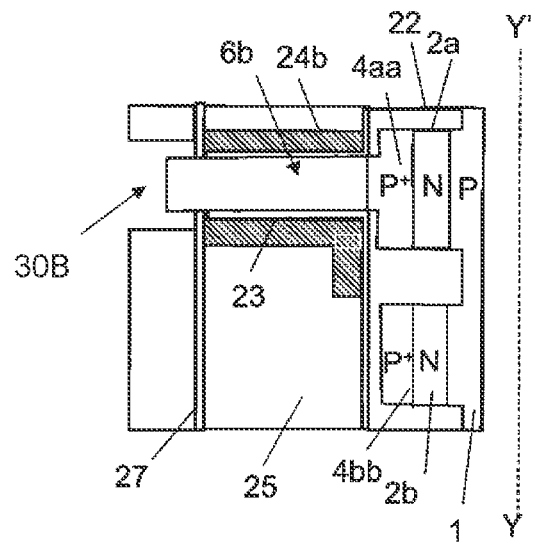

Next, as shown in FIGS. 1MA to 1MC, the mask material layers 7a, 7b, 7c, 7d, 7e, 7f are removed to form recesses 30A, 30B, 30C, 30D, 30E, 30F on the periphery of, and on the top of Si pillars 6a to 6f.

Figure 1N:
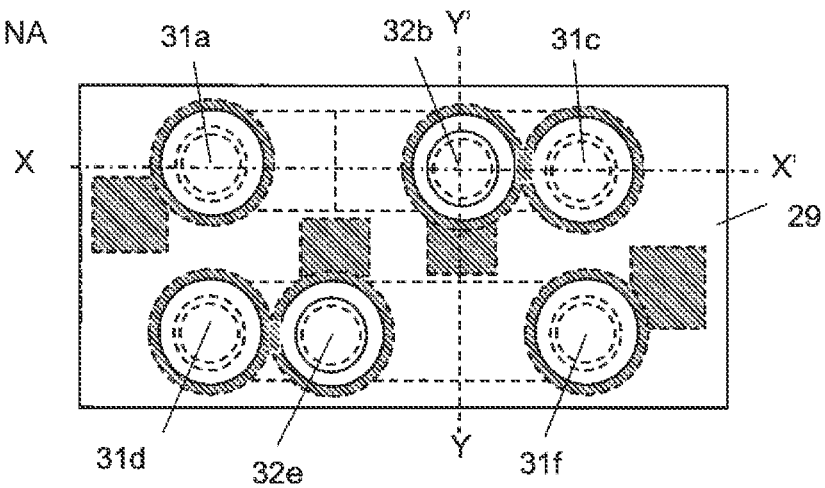
FIG. 1NA and FIGS. 1NB and 1NC are respectively a plane view and cross-sectional structural views for describing a manufacturing method of a pillar-shaped semiconductor device having SGTs according to the first embodiment.
Figure 1N:
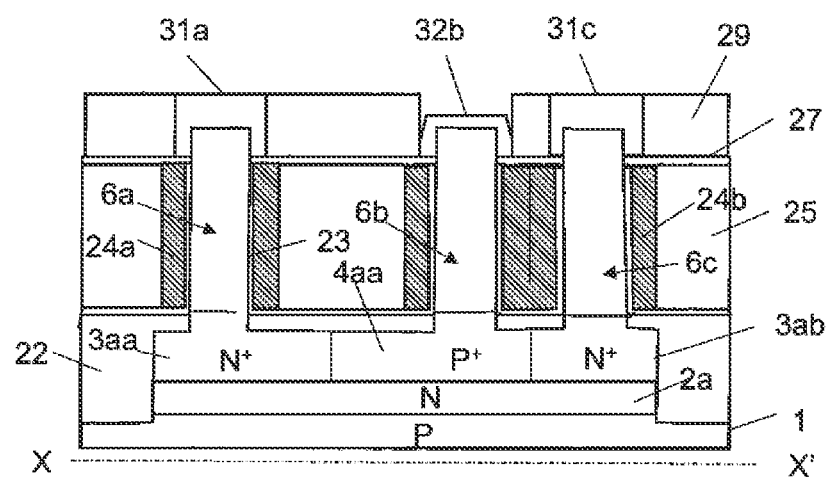
Figure 1N:
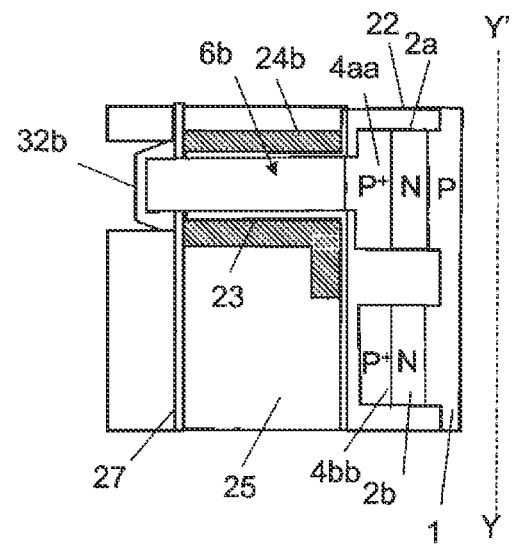

Next, the entire area is covered with a SiO₂ layer (not shown) by CVD method. Then, as shown in FIGS. 1NA to 1NC, the SiO₂ layer is polished by CMP method such that its upper surface position comes to the upper surface position of the SiN layer 29 to form SiO₂ layers 31a, 31b (not shown), 31c, 31d, 31e (not shown), 31f in the recesses 30A, 30B, 30C, 30D, 30E, 30F to cover the top of the Si pillars 6a to 6f. Then, the SiO₂ layers 31b, 31e are removed by lithography and chemical etching method. Then, P⁺ layers 32b (one of the first impurity layer and the second impurity layer), 32e (one of the first impurity layer and the second impurity layer) containing acceptor impurities are formed in the recesses 30B, 30E by selective epitaxial crystal growth method to cover the top of the Si pillars 6b, 6e. The P⁺ layers 32b, 32e are formed such that each of their periphery does not exist outside of each of the periphery of the recesses 30B, 30E in planar view. Prior to forming the P⁺ layers 32b, 32e, the top of the Si pillars 6b, 6e are preferably thinly oxidized, and then the oxidized film is removed to remove a damaged layer of the surface layer of the top of Si pillars 6b, 6e and clean thereof.

Figure 10A:
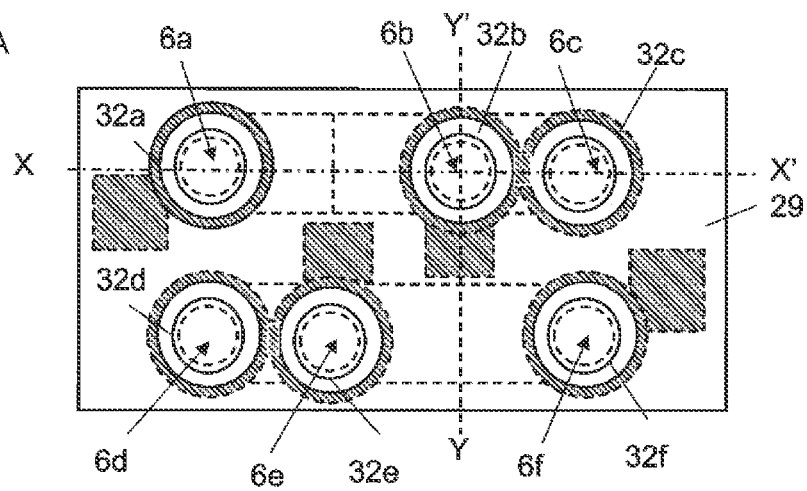
Figure 10B:
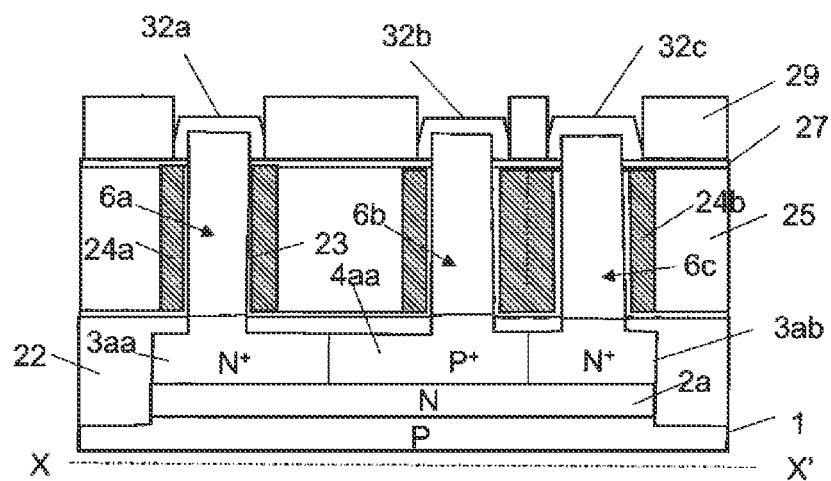
Figure 10C:
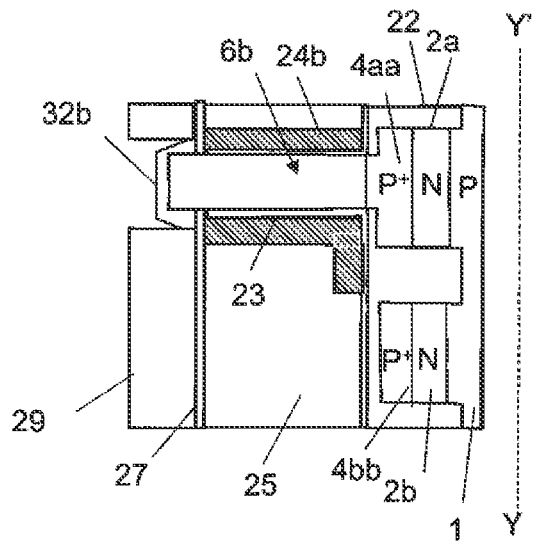

Next, the entire area is covered with a SiO₂ layer (not shown) and the SiO₂ layer is polished by CMP method such that its upper surface position becomes same as the upper surface position of the SiN layer 29 to cover the P⁺ layers 32b, 32e with the SiO₂ layer (not shown). Then, the SiO₂ layers 31a, 31c, 31d, 31f are removed by lithography and chemical etching method. Then, as shown in FIGS. 10A to 10C, N⁺ layers 32a, 32c (the second impurity layer when the P⁺ layer 32b is the first impurity layer, and the first impurity layer when the P⁺ layer 32b is the second impurity layer), 32d (the second impurity layer when the P⁺ layer 32e is the first impurity layer, and the first impurity layer when the P⁺ layer 32e is the second impurity layer), and 32f containing donor impurities are formed by selective epitaxial crystal growth method in the recesses 30A, 30C, 30D, 30F to cover Si pillars 6a, 6c, 6d, 6f. The N⁺ layers 32a, 32c, 32d, 32f are formed such that each of their periphery does not exist outside of each of the periphery of the recesses 30A, 30C, 30D, 30F in planar view. Then, the SiO₂ layers on the P⁺ layers 32b, 32e are removed.

Figure 1P:
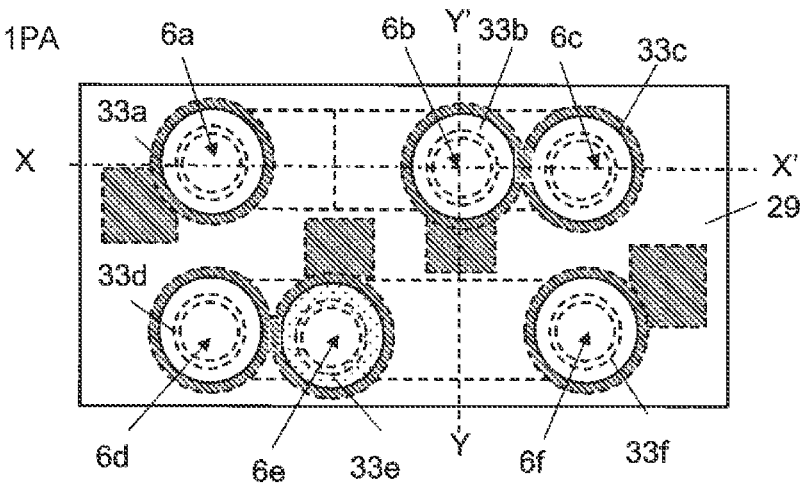
FIG. 1PA and FIGS. 1PB and 1PC are respectively a plane view and cross-sectional structural views for describing a manufacturing method of a pillar-shaped semiconductor device having SGTs according to the first embodiment.
Figure 1P:
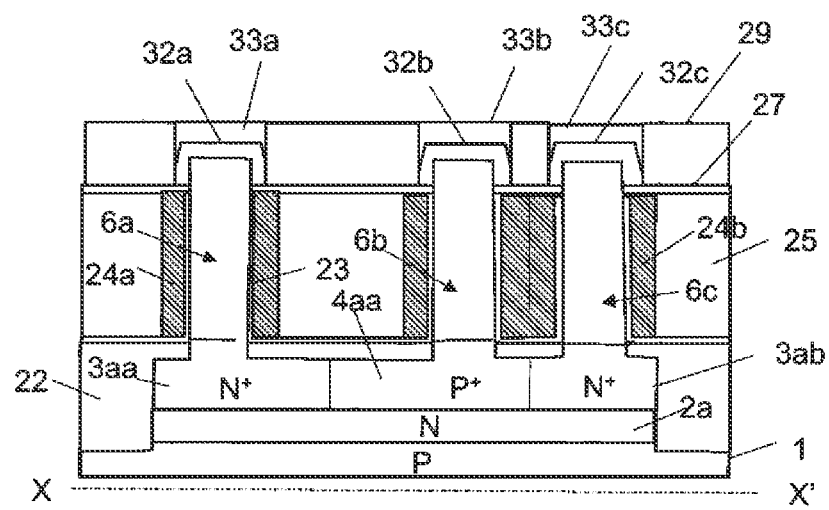
Figure 1P:
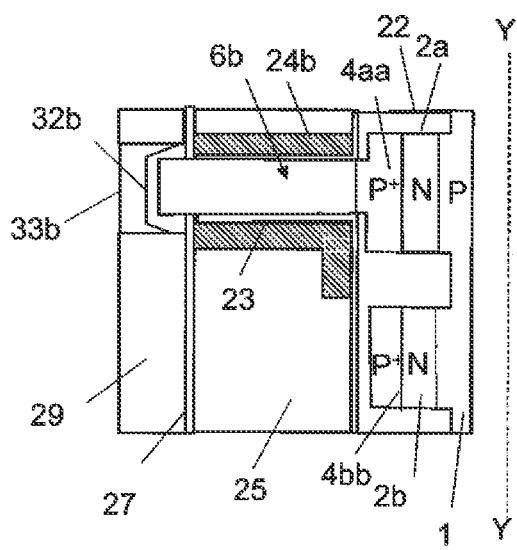

Next, the entire area is covered with a thin Ta layer (not shown) and a W layer (not shown). Then, as shown in FIGS. 1PA to 1PC, the W layer is polished by CMP method such that its upper surface position comes to the upper surface position of the SiN layer 29 to form W layers 33a, 33b, 33c, 33d, 33e, 33f. In this case, the Ta layer between the N⁺ layers 32a, 32c, 32d, 32f and P⁺ layers 32b, 32e, and the W layer 33a, 33b, 33c, 33d, 33e, 33f is a buffer layer for decreasing contact resistance of these two layers. It may be a single layer or multiple layers of other material layers.

Figure 1Q:
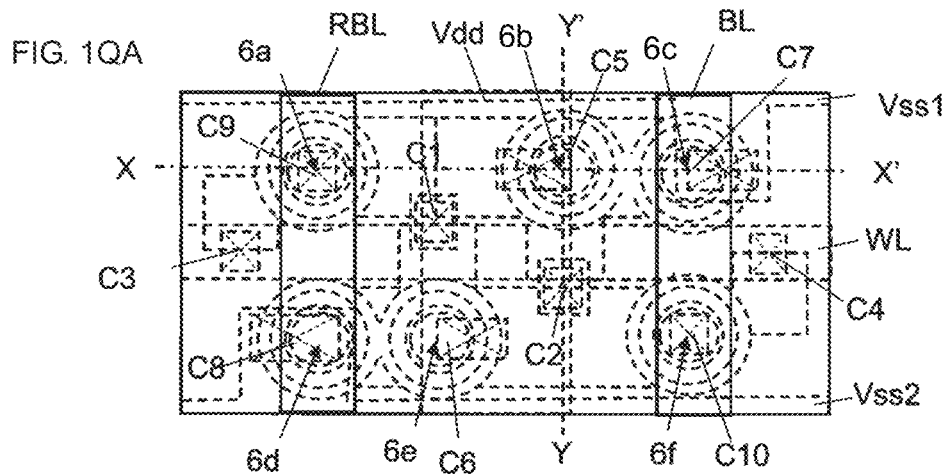
FIG. 1QA and FIGS. 1QB and 1QC are respectively a plane view and cross-sectional structural views for describing a manufacturing method of a pillar-shaped semiconductor device having SGTs according to the first embodiment.
Figure 1Q:
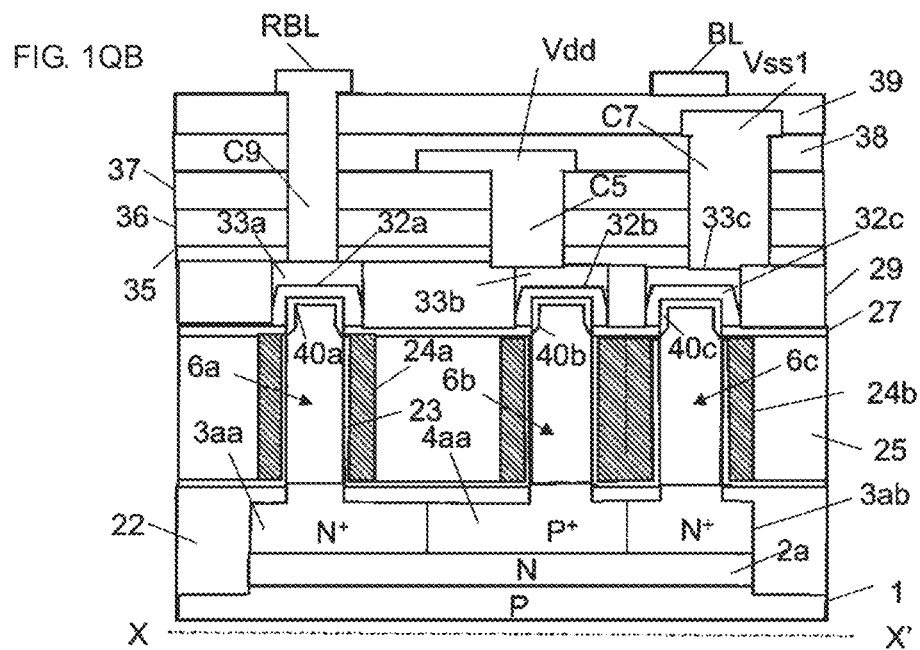
Figure 1Q:
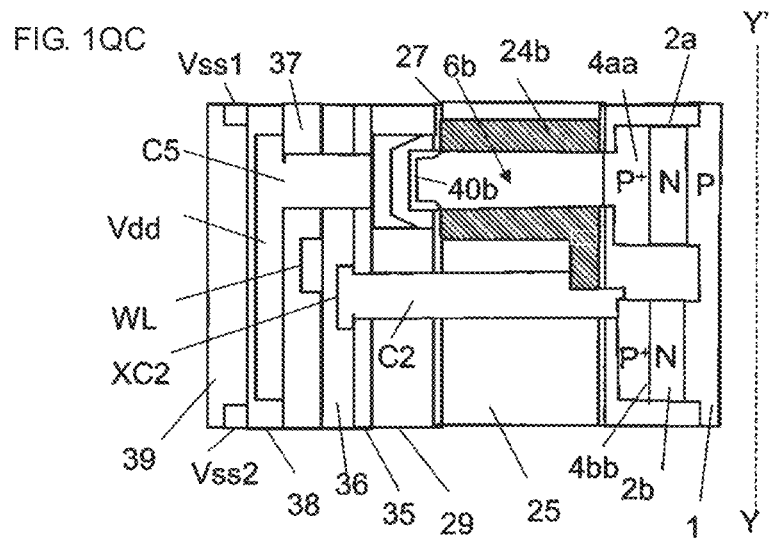

Next, as shown in FIGS. 1QA to 1QC, a SiO₂ layer 35 having a flat upper surface is formed over the entire area. Then, a connection line metal layer XC1 (not shown) is formed via a contact hole C1 formed on the interface between the N⁺ layer 3aa and the P⁺ layer 4aa in planar view and on the TiN layer 24c. At the same time, a connection line metal layer XC2 is formed via a contact hole C2 formed on the interface between the N⁺ layer 3bb and the P⁺ layer 4bb in planar view and on the TiN layer 24b. A SiO₂ layer 36 having a flat upper surface is formed over the entire area. Then, a word line metal layer WL is formed via contact holes C3, C4 formed on the TiN layers 24a, 24d. A SiO₂ layer 37 having a flat upper surface is formed over the entire area. Then, a supply line metal layer Vdd is formed via contact holes C5, C6 formed on the W layers 33b, 33e on the P⁺ layers 32b, 32e. Then, a ground line metal layer Vss1 is formed via a contact hole C7 formed on the W layer 33c on the N⁺ layer 32c. At the same time, a ground line metal layer Vss2 is formed via a contact hole C8 formed on the W layer 33d on the N⁺ layer 32d. Then, a SiO₂ layer 39 having a flat upper surface is formed over the entire area. Then, a bit output line metal layer BL and a reverse bit output line metal layer RBL are formed via contact holes C9, C10 formed on the W layers 33a, 33f on the N⁺ layers 32a, 32f. Thus, an SRAM cell circuit is formed on the P layer substrate 1. In the SRAM circuit, loading SGTs are formed at the Si pillars 6b, 6e, driving SGTs are formed at the Si pillars 6c, 6d, and selection SGTs are formed at the Si pillars 6a, 6f.

Here, after forming N⁺ layers 32a, 32c, 32d, 32f and the P⁺ layers 32b, 32e shown in FIGS. 1NA to 1NC and FIGS. 1OA to 1OC, donor or acceptor impurities are diffused by heating process from the N⁺ layers 32a, 32c, 32d, 32f and the P⁺ layers 32b, 32e into the top of the Si pillars 6a to 6f to form N⁺ layers 40a, 40c, 40d, 40f (not shown), and P⁺ layers 40b, 40e (not shown). Distributing form of the N⁺ layers 40a, 40c, 40d, 40f and the P⁺ layers 40b, 40e are formed at a surface layer or entire inside of the Si pillars 6a to 6f depending on the heating process history and diameters of the Si pillars 6a to 6f. The N⁺ layers 32a, 32c, 32d, 32f, 40a, 40d, 40c, 40f, and the P⁺ layers 32b, 32e, 40b, 40e (the N⁺ layers 32c, 32d, 40c, 40d are the second impurity layers when the P⁺ layers 32b, 32e, 40b, 40e are the first impurity layers, and the N⁺ layers 32c, 32d, 40c, 40d are the first impurity layers when the P⁺ layers 32b, 32e, 40b, 40e are the second impurity layers) are formed to be linked to the top of the Si pillars 6a to 6f.

Also, as shown in FIGS. 1QA to 1QC, at the bottom of the Si pillars 6a to 6f, the N⁺ layers 3aa, 3ab, 3ba, 3bb and the P⁺ layers 4aa, 4bb, each of which becomes a source or a drain of SGT, are formed to be linked on the N layers 2a, 2b. On the other hand, the N⁺ layers 3aa, 3ab, 3ba, 3bb and the P⁺ layers 4aa, 4bb may be formed at the bottom of the Si pillars 6a to 6f such that the N⁺ layers 3aa, 3ab, 3ba, 3bb and the P⁺ layers 4aa, 4bb are linked via a metal layer or metal alloy layer. Also, the N⁺ layers 3aa, 3ab, 3ba, 3bb and the P⁺ layers 4aa, 4bb may be formed to be linked to side surfaces of the bottom of the Si pillars 6a to 6f. As described above, the N⁺ layers 3aa, 3ab, 3ba, 3bb and the P⁺ layers 4aa, 4bb, each of which becomes a source or a drain of SGT, may be formed inside of the bottom of the Si pillars 6a to 6f or on the periphery of the Si pillars 6a to 6f in contact with outside of the side surfaces thereof, and each of them may be electrically linked via other conductor materials. This is also applicable to other embodiments according to the present invention.

There are requirements for providing high-density SRAM cells.

Requirement 1

SGTs for loading are formed at Si pillars 6b, 6e and SGTs for driving are formed at Si pillars 6c, 6d. For providing high-density SRAM cells, a distance between adjacent Si pillars 6b and 6c is required to be reduced. On the other hand, impurity regions, including top conductor layers connecting to the top of adjacent Si pillars 6b, 6c, must be formed to be separate each other. Similarly, a distance between adjacent Si pillars 6d and 6e is required to be reduced. On the other hand, impurity regions, including top conductor layers connecting to the top of adjacent Si pillars 6d, 6e, must be formed to be separate each other.

Requirement 2

When spaces between Si pillars 6b and 6c and between Si pillars 6d and 6e are too narrow, the gate TiN layers 24b, 24c become too thin, and thus required work function as a gate electrode cannot be obtained. Also, when the spaces are too wide, the TiN layers 24b, 24c are separated between the Si pillars 6b and 6c and between the Si pillars 6d and 6e. Thus, in order to increase degree of integration of the SRAM cell, the spaces between the Si pillars 6b and 6c and between the Si pillars 6d and 6e must be optimized.

Requirement 3

In a conventional configuration, in which impurity regions, each of which becomes a source or a drain of SGT, are formed on the top of the Si pillars 6a, 6b, 6c, 6d, 6e, 6f, and contact holes connecting to outside lines are formed from the upper surfaces of the impurity regions, connecting area between the impurity regions and the channels and contact holes are limited to cross-sectional area of the Si pillars 6a to 6f, and thus as SRAM cells become higher density, problems of increased resistance of these impurity regions arise. Therefore, connecting areas between the impurity regions and the channels and contact holes are required to be large. Then, the impurity regions must reserve their volumes required to function as a source or a drain of SGT.

Requirement 4

When impurity regions are formed on the top of the Si pillars 6a, 6b, 6c, 6d, 6e, 6f by selective or non-selective epitaxial crystal growth method involving donor or acceptor impurities, in order to form impurity regions having better crystallinity, the larger the areas of the top of the Si pillars 6a, 6b, 6c, 6d, 6e, 6f on which the epitaxial crystal growth occurs are, the better.

According to the manufacturing method of the first embodiment, following features are obtained.

1. For the above requirements, this embodiment has following features.

For Requirement 1

In this embodiment, distances between the Si pillars 7b and 7c and between the Si pillars 7d and 7e in planar view are defined by widths of the band-like SiGe layers 8a, 8b. The widths of the band-like SiGe layers 8a, 8b can be formed smaller than the smallest width of a resist layer which can be formed lithographically, as described in FIGS. 1BA to 1BC. Thus, the gate TiN layers 24b, 24c can be made to contact at entire side surfaces of SGT channels between the Si pillars 7b and 7c and between the Si pillars 7d and 7e in vertical direction. This indicates that distances between gate electrodes of the Si pillars 7b, 7c and between Si pillars 7d, 7e can be made to be closest in planar view. Then, since the N⁺ layers 32a, 32c, 32d, 32f and the P⁺ layers 32b, 32e, which are impurity regions of SGTs, are formed in the recesses 30A, 30B, 30C, 30D, 30E, 30F separated each other, adjacent N⁺ layers 32a, 32c, 32d, 32f and P⁺ layers 32b, 32e cannot be contacted each other. Then, the recesses 30a, 30b, 30c, 30d, 30e, 30f on the periphery of the Si pillars 6a to 6f in the recesses 30A, 30B, 30C, 30D, 30E, 30F, for forming the N⁺ layers 32a, 32c, 32d, 32f and the P⁺ layers 32b, 32e are formed in self-aligning manner without using lithography. Thus, high-density N⁺ layers 32a, 32c, 32d, 32f and P⁺ layers 32b, 32e are formed. This leads to high-density SRAM cells to be provided.

For Requirement 2

The spaces between the Si pillars 6b and 6c and between the Si pillars 6d and 6e is defined by widths of the band-like SiGe layers 8a, 8b. The widths of the band-like SiGe layers 8a, 8b can be formed smaller than the smallest width of a resist layer which can be formed lithographically, as described in FIGS. 1BA to 1BC. By changing the widths of the band-like SiGe layers 8a, 8b to be narrowed, it is possible to obtain required spaces between the Si pillars 6b and 6c and between the Si pillars 6d and 6e. Thus, optimization of providing high-density SRAM cells may be intended.

For Requirement 3

In this embodiment, each of the N⁺ layers 32a, 32c, 32d, 32f and the P⁺ layers 32b, 32e and each channel of SGTs are connected on upper surfaces and side surfaces of the top of the Si pillars 6a, 6b, 6c, 6d, 6e, 6f. Thus, it is possible to make a connection area between the impurity region and the channel to be larger than that of configurations in which the impurity region is formed only inside of the top of the Si pillars 6a to 6f. Then, since upper surface areas of the N⁺ layers 32a, 32c, 32d, 32f and the P⁺ layers 32b, 32e in planar view are larger than the Si pillars 6a, 6b, 6c, 6d, 6e, 6f, it is possible to make contact holes C1 to C10 large. Also, in this embodiment, by changing a depth of the recesses 30A, 30B, 30C, 30D, 30E, 30F and a crystal growth time for the N⁺ layers 32a, 32c, 32d, 32f and the P⁺ layers 32b, 32e for growing crystals, it can be easily achieved to reserve volumes of the N⁺ layers 32a, 32c, 32d, 32f and the P⁺ layers 32b, 32e for ensuring operations as impurity regions, without increasing areas of the impurity regions in planar view. For Requirement 4

In this embodiment, formation of the N⁺ layers 32a, 32c, 32d, 32f and the P⁺ layers 32b, 32e by selective epitaxial crystal growth is made both on upper surfaces and side surfaces of the top of the Si pillars 6a, 6b, 6c, 6d, 6e, 6f. Thus, it is possible to make an exposed area of the Si pillars 6a, 6b, 6c, 6d, 6e, 6f for the selective epitaxial crystal growth larger than that of configurations in which the impurity region is formed only inside of the top of the Si pillars 6a to 6f. Thus, impurity regions having better crystallinity are formed. This leads to improvement of SRAM cell properties.

2. In order to obtain good SRAM cell properties, how to form shapes of the Si pillars 6a to 6f in planar view with high precision is important. In this embodiment, as shown in FIGS. 1CA to 1CC and FIGS. 1DA to 1DC, the Si pillars 6a to 6f are formed by using band-like SiN layers 13aa, 13ab, 13ba, 13bb formed on each side of the band-like SiGe layers 8a, 8b. The band-like SiN layers 13aa, 13ab, 13ba, 13bb are formed by ALD (Atomic Layered Deposition) method in which a SiN film is deposited in each monoatomic layer. This means that a thickness of the band-like SiN layers 13aa, 13ab, 13ba, 13bb may be formed in a precision of monoatomic layer. Similarly, the band-like mask material layers 12aa, 12ab, 12ba, 12bb exhibit a shape of the top part of the band-like SiN layers 13aa, 13ab, 13ba, 13bb as it is, and thus the band-like SiN layers 13aa, 13ab, 13ba, 13bb can be formed with high precision. This leads to the formation of the Si pillars 6a to 6f with high precision. Thin is also applicable to the formation of the band-like mask material layers 17a, 17b. Thus, the Si pillars 6a to 6f are formed with high precision.

3. In this embodiment, an SRAM cell consisting of six SGTs is described. On the other hand, the present invention is also applicable to an SRAM cell consisting of eight SGTs. In the SRAM cell consisting of eight SGTs, each of two rows aligned in Y direction consists of four SGTs. Then, in the four SGTs, two SGTs for loading or driving are adjacently aligned. In this case, gate electrodes of three aligned SGTs for loading and driving are connected, and impurity layers at upper parts of the adjacent SGTs for loading and driving must be separately formed. Since the relationship between the adjacent SGTs for loading and driving is same as that of the SRAM cell consisting of six SGTs, it is possible to form the SRAM cell consisting of eight SGTs at high density by applying the method according to this embodiment. The present invention is also applicable to the formation of other SRAM cells consisting of a plurality of SGTs.

4. In this embodiment, an example in which the present invention is applied to an SRAM cell is described. In a logic circuit formed on the same chip, most utilized inverter circuit is configured by at least two N-channel SGT and P-channel SGT, and gate electrodes of the N-channel SGT and the P-channel SGT are connected. Then, impurity regions at upper part of each of the two N-channel SGT and the P-channel SGT must be separated. Thus, the relation between the loading SGT and the driving SGT of the SRAM cell and the relation between the N-channel SGT and the P-channel SGT of the inverter circuit are the same. This indicates that by applying the present invention to a microprocessor circuit including, for example, an SRAM cell area and a logic circuit area, high-density microprocessor circuit can be achieved. Also, the present invention can be applied to the formation of at least two aligned SGTs having the same polarity. In this case, impurity layers formed to be connected to the top of semiconductor pillars forming the SGTs have the same polarity, and thus these impurity layers may be formed simultaneously.

5. In this embodiment, Si pillars 6a to 6f of circular shape in planar view are formed. Some or all the Si pillars 6a to 6f may be easily formed to have a shape in planar view such as circular, elliptic, or elongated shape in one direction. Then, also in a logic circuit area formed to be separated from the SRAM area, mixture of Si pillars having different shapes in planar view may be formed in the logic circuit area, depending on logic circuit design. Thus, high-density and high-performance microprocessor circuits can be achieved.

Second Embodiment

Figure 2A:
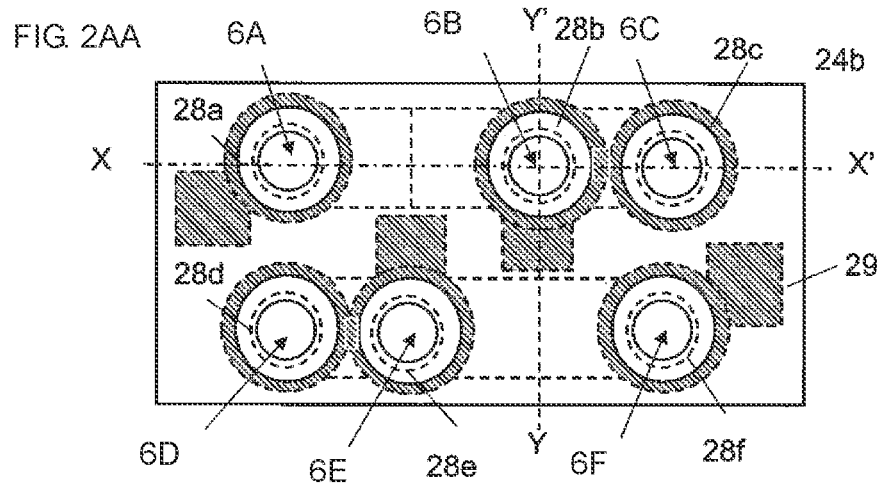
FIG. 2AA and FIGS. 2AB and 2AC are respectively a plane view and cross-sectional structural views for describing a manufacturing method of a pillar-shaped semiconductor device having SGTs according to the second embodiment of the present invention.
Figure 2A:
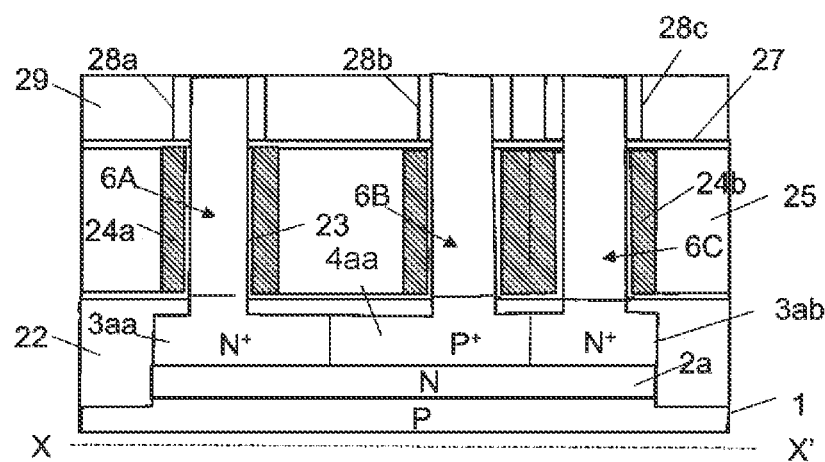
Figure 2A:
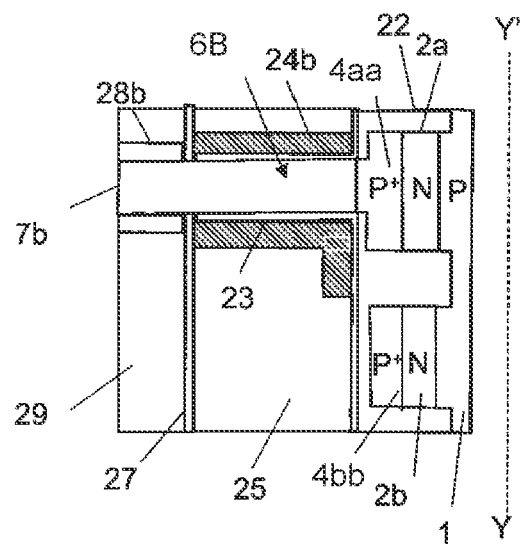

Hereinafter, a manufacturing method of an SRAM circuit having SGTs according to the second embodiment of the present invention is described with reference to FIGS. 2AA to 2CC. In the figures, figures suffixed with A are plane views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

The processes of FIGS. 1AA to 1JC are performed. Then, mask material layers 7a, 7b, 7c, 7d, 7e, 7f on Si pillars 6A, 6B, 6C, 6D, 6E, 6F are removed. It is preferred that a height of the Si pillars 6A, 6B, 6C, 6D, 6E, 6F is higher than the Si pillars 6a, 6b, 6c, 6d, 6e, 6f by a thickness of the mask material layers 7a, 7b, 7c, 7d, 7e, 7f. Then, a process of FIGS. 1KA to 1KC is performed to form SiO₂ layers 28a to 28f surrounding the top of the Si pillars 6A to 6F, and a SiN layer 29, as shown in FIGS. 2AA to 2AC.

Figure 2B:
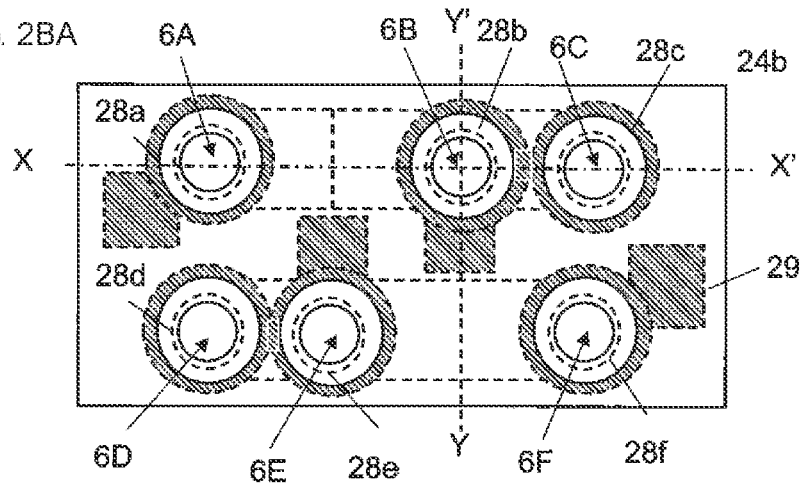
FIG. 2BA and FIGS. 2BB and 2BC are respectively a plane view and cross-sectional structural views for describing a manufacturing method of a pillar-shaped semiconductor device having SGTs according to the second embodiment of the present invention.
Figure 2B:
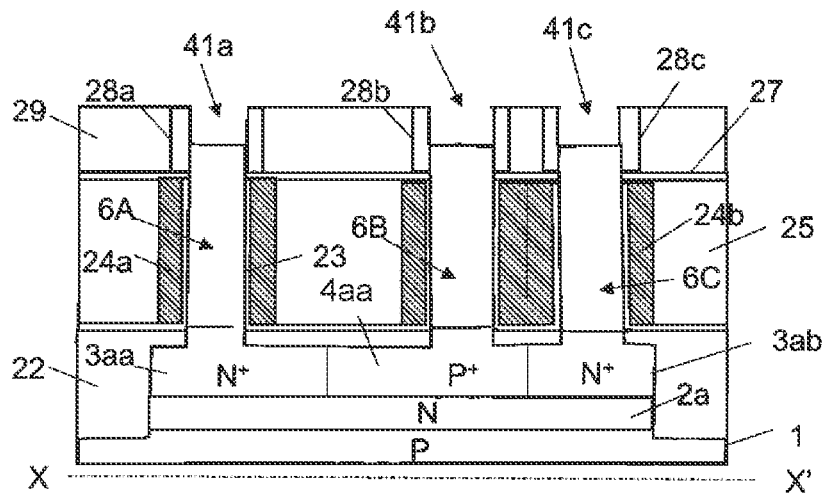
Figure 2B:
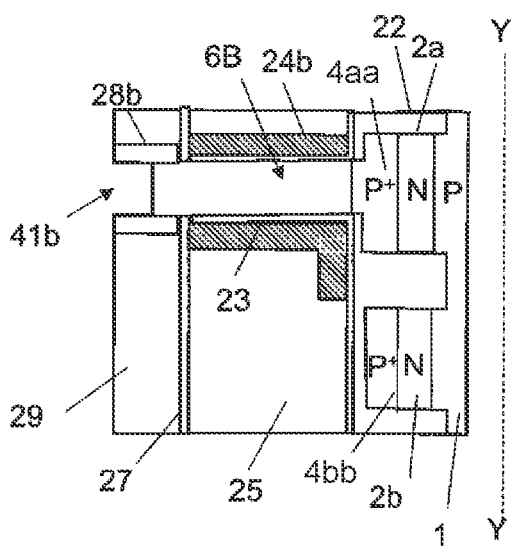

Next, as shown in FIGS. 2BA to 2BC, the top parts of the Si pillars 6A to 6F are etched with the SiO₂ layers 28a to 28f and the SiN layer 29 as a mask such that upper surface positions of the Si pillars come to a position above the upper surface position of a SiN layer 27 to form recesses 41a, 41b, 41c, 41d, 41e, 41f.

Figure 2C:
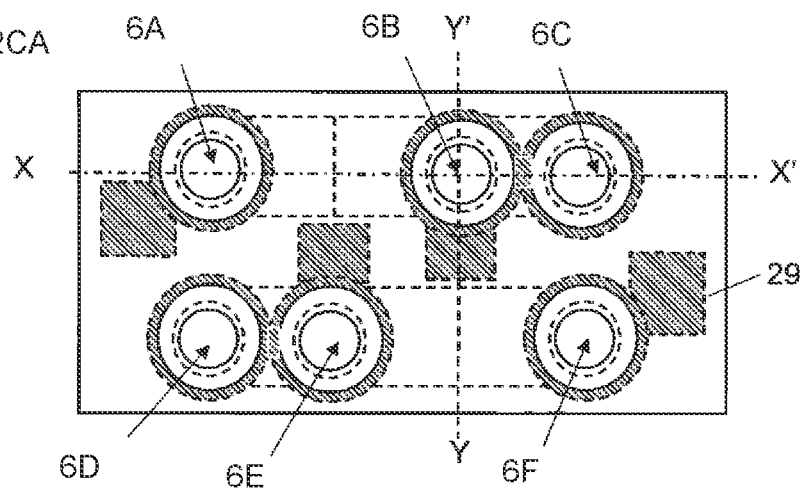
FIG. 2CA and FIGS. 2CB and 2CC are respectively a plane view and cross-sectional structural views for describing a manufacturing method of a pillar-shaped semiconductor device having SGTs according to the second embodiment of the present invention.
Figure 2C:
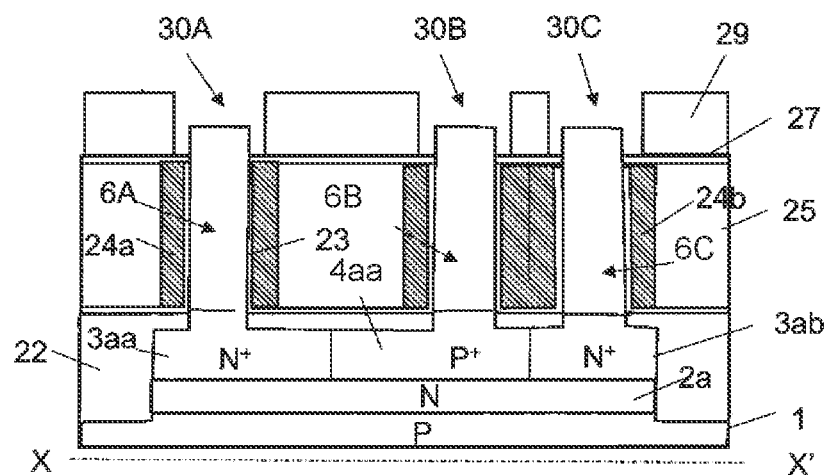
Figure 2C:
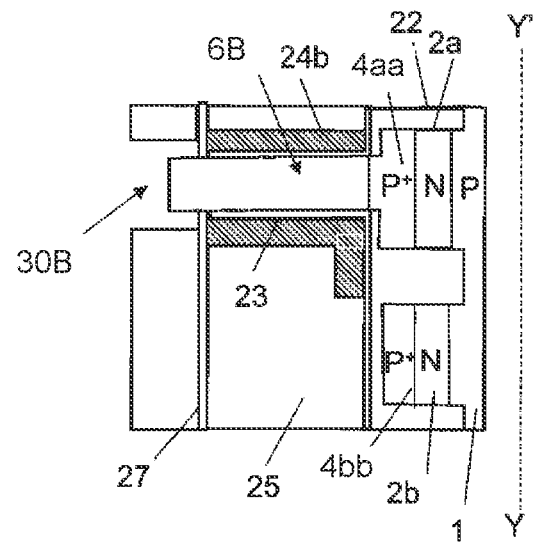

Next, as shown in FIGS. 2CA to 2CC, the SiO₂ layers 28a to 28f are etched to form recesses 30A, 30B, 30C, 30D, 30E, 30F surrounding the Si pillars 6A to 6F, and thus provide a structure same as that of FIGS. 1MA to 1MC. After that, by performing processes of FIGS. 1NA to 1QC, an SRAM cell is formed on a P layer substrate 1, similar to the first embodiment.

This embodiment has features as follows.

In the first embodiment, the depth of the recesses 30A to 30F on the top of the Si pillars 6a to 6f shown in FIGS. 1MA to 1MC is defined by the thickness of the mask material layers 7a to 7f shown in FIGS. 1LA to 1LC. The mask material layers 7a to 7f are used as an etching mask or stopper material layer in RIE and CMP processes shown in FIGS. 1BA to 1BC and FIGS. 1IA to 1LC. Thus, uniformity-in-wafer at each process affects uniformity-in-wafer of the depth of the recesses 30A to 30F on the top of the Si pillars 6a to 6f. Therefore, it is necessary to devise a way to prepare the mask material layers 7a to 7f, such as selecting materials thereof, making them multilayered structure consisting of material layers suitable to each process, and the like. On the other hand, in this embodiment, by mainly increasing precision of CMP and etching processes to the top of the Si pillars 6A to 6F in FIGS. 2AA to 2AC and FIGS. 2BA to 2BC, improvement of the uniformity of the depth of the recesses 30A to 30F on the top of the Si pillars 6A to 6F may be intended.

Third Embodiment

Hereinafter, a manufacturing method of an SRAM circuit having SGTs according to the third embodiment of the present invention is described with reference to FIGS. 3AA to 3CC. In the figures, figures suffixed with A are plane views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

The processes of FIGS. 1AA to 1MC are performed. Then, similar to FIGS. 1NA to 1NC, after forming $SiO_2$ layers 31a to 31f surrounding the top of the Si pillars 6a to 6f in recesses 30a to 30f, the $SiO_2$ layers 31b, 31e are removed. Then, as shown in FIGS. 3AA to 3AC, a P⁺ layer 43 containing acceptor impurities is formed in the recesses 30b, 30e and on the SiN layer 29 and the $SiO_2$ layers 31a, 31c, 31d, 31f by epitaxial crystal growth method. In addition, in order to improve crystallinity of the P⁺ layer 43, single crystal thin film semiconductor layer may be formed before the P⁺ layer 43 is formed.

Figure 3A:
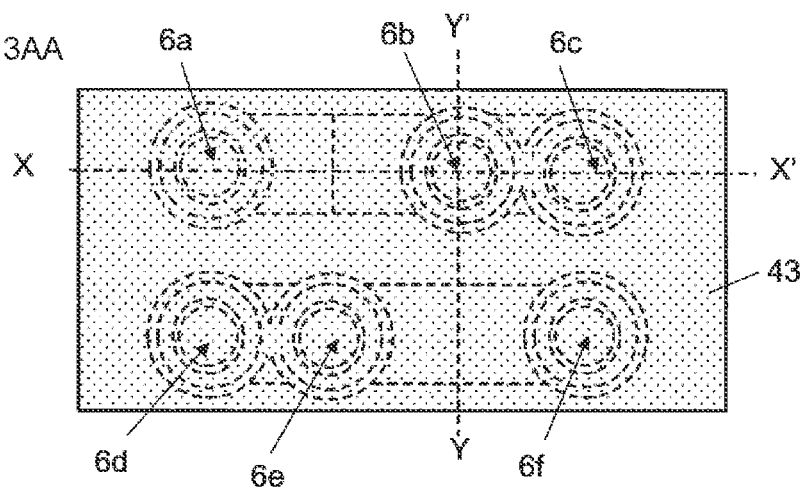
FIG. 3AA and FIGS. 3AB and 3AC are respectively a plane view and cross-sectional structural views for describing a manufacturing method of a pillar-shaped semiconductor device having SGTs according to the third embodiment of the present invention.
Figure 3A:
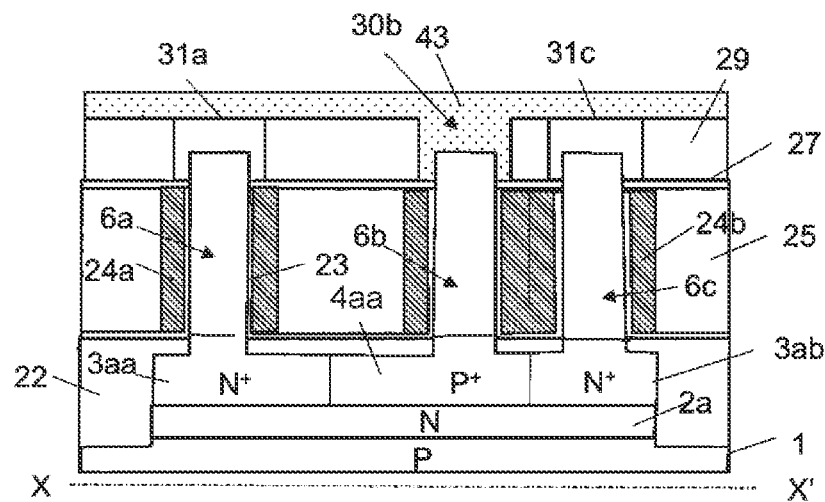
Figure 3A:
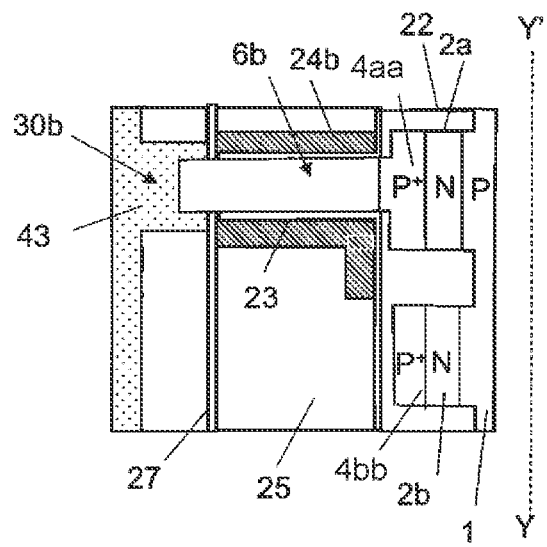
Figure 3B:
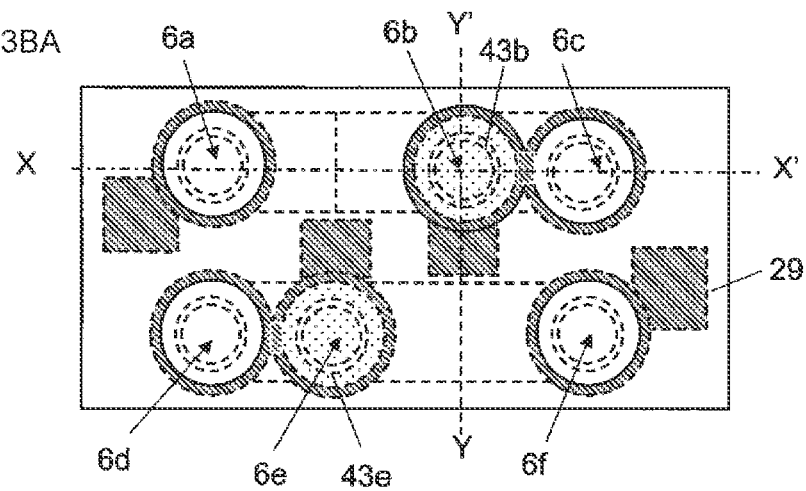
FIG. 3BA and FIGS. 3BB and 3BC are respectively a plane view and cross-sectional structural views for describing a manufacturing method of a pillar-shaped semiconductor device having SGTs according to the third embodiment of the present invention.
Figure 3B:
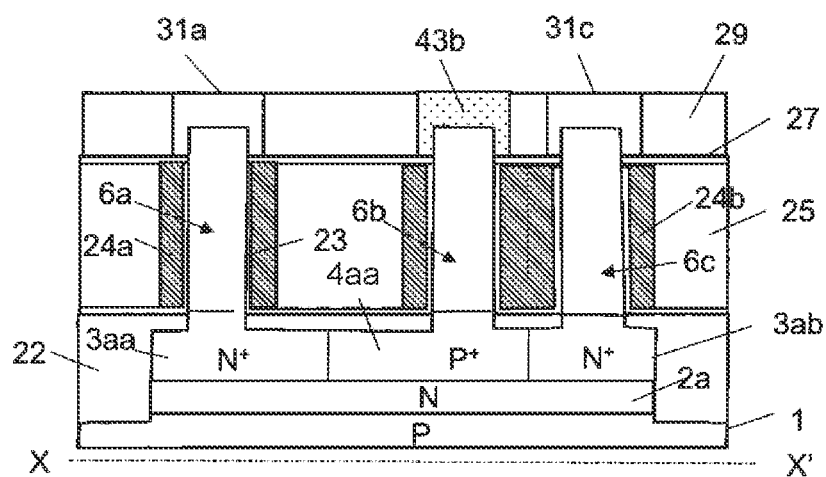
Figure 3B:
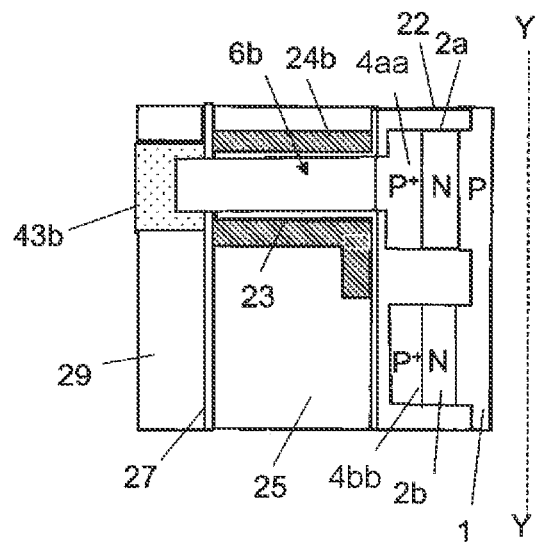

Then, as shown in FIGS. 3BA to 3BC, the P⁺ layer 43 is etched back or CMP method is used such that its upper surface comes to the upper surface position of the SiN layer 29 to form P⁺ layers 43b, 43e surrounding the top of the Si pillars 6b, 6e in the recesses 30b, 30e.

Figure 3C:
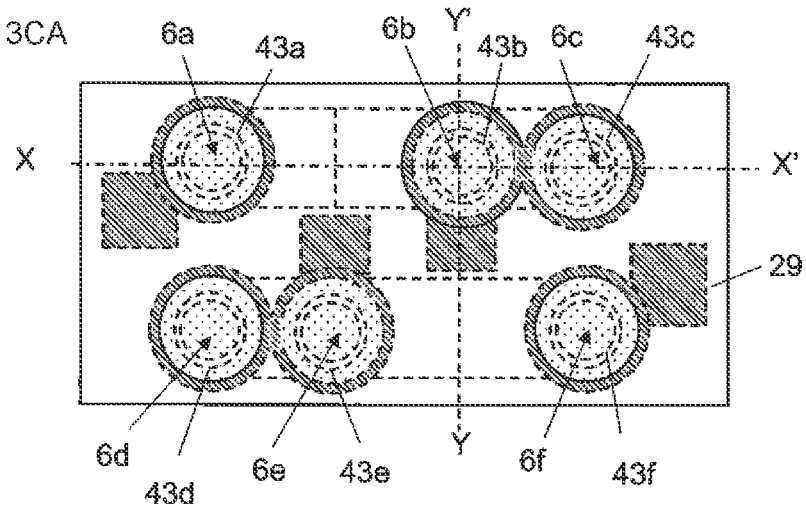
FIG. 3CA and FIGS. 3CB and 3CC are respectively a plane view and cross-sectional structural views for describing a manufacturing method of a pillar-shaped semiconductor device having SGTs according to the third embodiment of the present invention.
Figure 3C:
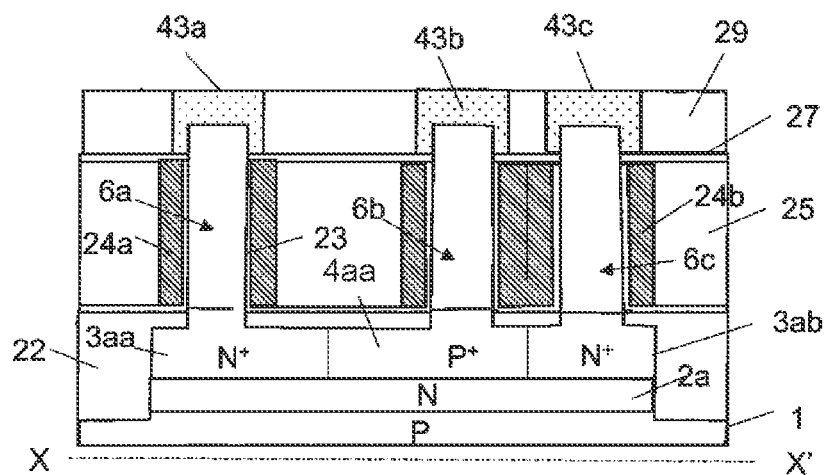
Figure 3C:
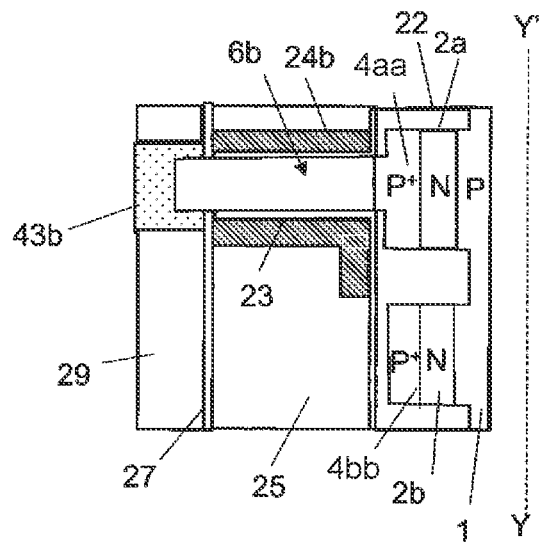

Next, as shown in FIGS. 3CA to 3CC, N⁺ layers 43a, 43c, 43d, 43f surrounding the top of the Si pillars 6a, 6c, 6d, 6f are formed in the recesses 30a, 30c, 30d, 30f, by the processes similar to those for forming the P⁺ layers 43b, 43e. After that, by performing a process shown in FIGS. 1QA to 1QC, an SRAM cell is formed on a P layer substrate 1, similar to the first embodiment.

This embodiment has features as follows.

In the first embodiment, selective epitaxial crystal growth method is used to form N⁺ layers 32a, 32c, 32d, 32f and P⁺ layers 32b, 32e. In the selective epitaxial crystal growth method, Si and donor or acceptor impurity atoms deposited on a SiN layer 29 on the periphery of recesses 30A to 30F are moved on the surface of the SiN layer 29 to reach the recesses 30A to 30F, and after that, crystal growth occurs in the recesses 30A to 30F to form the N⁺ layers 32a, 32c, 32d, 32f and the P⁺ layers 32b, 32e. Thus, the way of arrangement of the recesses 30A to 30F on the SiN layer 29 affects volumes of the N⁺ layers 32a, 32c, 32d, 32f and the P⁺ layers 32b, 32e and thus the volumes are not the same. This makes it difficult to form uniform N⁺ layers 32a, 32c, 32d, 32f and P⁺ layers 32b, 32e in the recesses 30A to 30F. On the other hand, in this embodiment, as shown in FIGS. 3AA to 3AC and FIGS. 3BA to 3BC, after forming a P⁺ layer 43 containing acceptor impurities in the recesses 30b, 30e and on the SiN layer 29 and the $SiO_2$ layers 31a, 31c, 31d, 31f, the P⁺ layer 43 is etched back or CMP method is used such that its upper surface comes to the upper surface position of the SiN layer 29 to form P⁺ layers 43b, 43e surrounding the top of the Si pillars 6b, 6e in the recesses 30b, 30e. Thus, variation in the volumes of the N⁺ layers 32a, 32c, 32d, 32f and the P⁺ layers 32b, 32e does not arise as in the case of the selective epitaxial crystal growth method.

Fourth Embodiment

Hereinafter, a manufacturing method of an SRAM circuit having SGTs according to the fourth embodiment of the present invention is described with reference to FIGS. 4A to 4C. FIG. 4A is a plane view, FIG. 4B is a cross-sectional structural view taken along line X-X' in FIG. 4A, and FIG. 4C is a cross-sectional structural view taken along line Y-Y' in FIG. 4A.

Before forming the P⁺ layer 43 shown in FIGS. 3AA to 3AC in the third embodiment, a thin semiconductor layer 46 of, for example Si, is entirely deposited by, for example ALD method, as shown in FIGS. 4A to 4C. Thus, it is entirely formed inside the recesses 30b, 30e. Then, a P⁺ layer 43 containing acceptor impurities is formed on the entire surface by epitaxial crystal growth method. Then, similar processes are also performed in forming N⁺ layers 32a, 32c, 32d, 32f. Then, after that, same processes as those described in the third embodiment are performed. Thus, an SRAM cell is formed on a P layer substrate 1, similar to the first embodiment. The thin single crystal semiconductor layer 46 may or may not contain acceptor or donor impurity atoms. Also, the thin single crystal semiconductor layer 46 may be other semiconductor material layers such as, for example, SiGe. Also, materials for the thin single crystal semiconductor layer 46 may be different in the P⁺ layer 43 and N⁺ layers (not shown). Also, since the P⁺ layer 43 having good crystallinity is required only inside of the recesses 30b, 30e, the thin semiconductor layer 46 may not be present on upper surfaces of the SiN layer 29 and the $SiO_2$ layers 31a, 31c, 31d, 31f.

This embodiment has features as follows.

1. In the third embodiment, SiN layers having no crystallinity are exposed as it is on the upper surfaces of the SiN layer 27 and on the side surfaces of the SiN layer 29 inside the recesses 30a to 30f. In epitaxial crystal growth method, from arrangement of atoms of the surface of single crystal layers, a single crystal layer grows continuously. Thus, single crystal layers cannot be formed on the surface of the exposed SiN layers 27, 29 inside the recesses 30a to 30f. Therefore, crystallinity of the P⁺ layer 43 and the N⁺ layer (not shown) formed inside the recesses 30a to 30f is compromised. On the other hand, in this embodiment, a thin single crystal semiconductor layer 46 is entirely formed inside the recesses 30b, 30e before forming the P⁺ layer 43 (this is same as in the N⁺ layers). Thus, crystallinity of the P⁺ layer 43 and the N⁺ layer (not shown) formed inside the recesses 30a to 30f is increased. Therefore, SGT properties are improved.

2. Also in the first embodiment, SiN layers having no crystallinity are exposed as it is on the upper surfaces of the SiN layer 27 and the side surfaces of the SiN layer 29 inside the recesses 30a to 30f. On the other hand, by covering the layers with a thin single crystal semiconductor layer before forming N⁺ layers 32a, 32c, 32d, 32f and P⁺ layers 32b, 32e by selective epitaxial crystal growth method similar to this embodiment, improvement of the crystallinity of the N⁺ layers 32a, 32c, 32d, 32f and the P⁺ layers 32b, 32e may be intended. Therefore, SGT properties are improved.

Fifth Embodiment

Figure 5A:
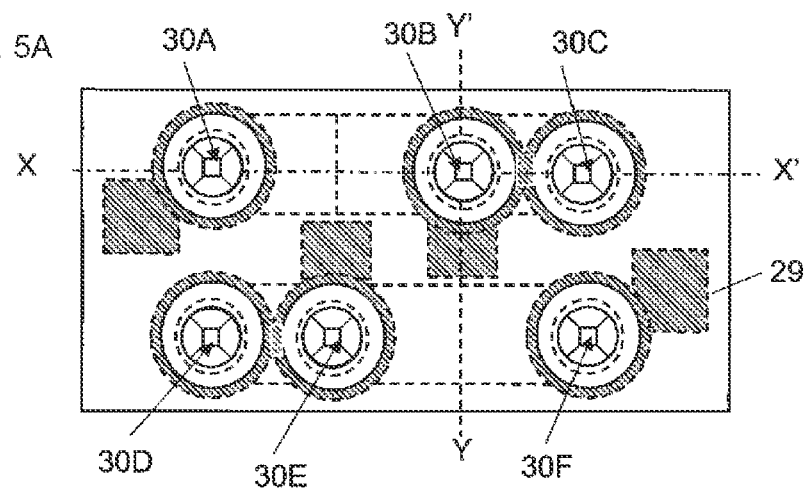
FIG. 5A and FIGS. 5B and 5C are respectively a plane view and cross-sectional structural views for describing a manufacturing method of a pillar-shaped semiconductor device having SGTs according to the fifth embodiment of the present invention.

Hereinafter, a manufacturing method of an SRAM circuit having SGTs according to the fifth embodiment of the present invention is described with reference to FIGS. 5A to 5C. FIG. 5A is a plane view, FIG. 5B is a cross-sectional structural view taken along line X-X' in FIG. 5A, and FIG. 5C is a cross-sectional structural view taken along line Y-Y' in FIG. 5A.

The processes of FIGS. 1AA to 1MC are performed. Then, the exposed top of the Si pillars 6a to 6f are etched by etchant including potassium hydroxide (KOH), sodium hydroxide (NaOH), etc. Thus, as shown in FIGS. 5A to 5C, the single crystal Si pillars 6a to 6f are subjected to an anisotropic etching by the etchant including KOH or NaOH, and after the etching, specific orientation faces 48a, 48b, 48c, 48d (not shown), 48e (not shown), 48f (not shown) are formed on the top of the Si pillars 6a to 6f. For example, when the upper face of the Si pillars 6a to 6f is (100), (111) faces are appeared on the side surfaces of the top of the Si pillars 6a to 6f. After that, by performing processes of FIGS. 1NA to 1QC, an SRAM cell is formed on a P layer substrate 1, similar to the first embodiment.

Figure 5B:
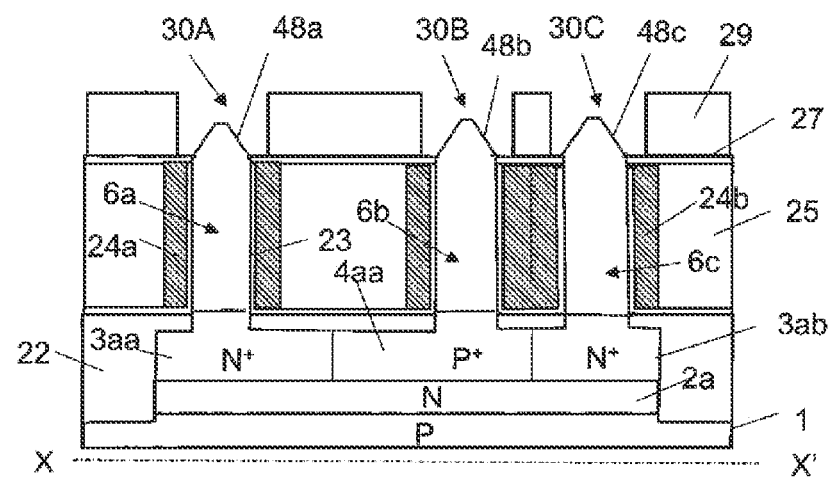
Figure 5C:
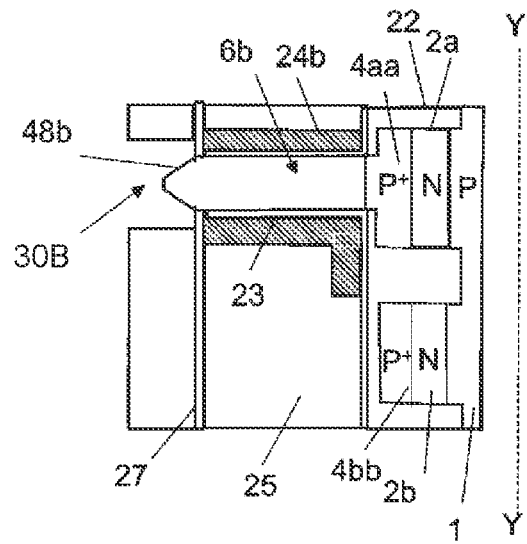
Figure 6:
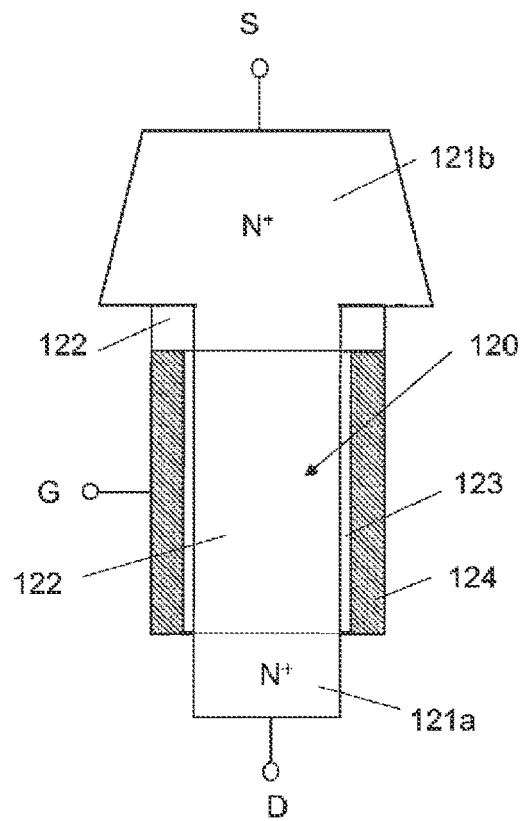
FIG. 6 is a schematic structural view showing a conventional SGT.
Figure 7:
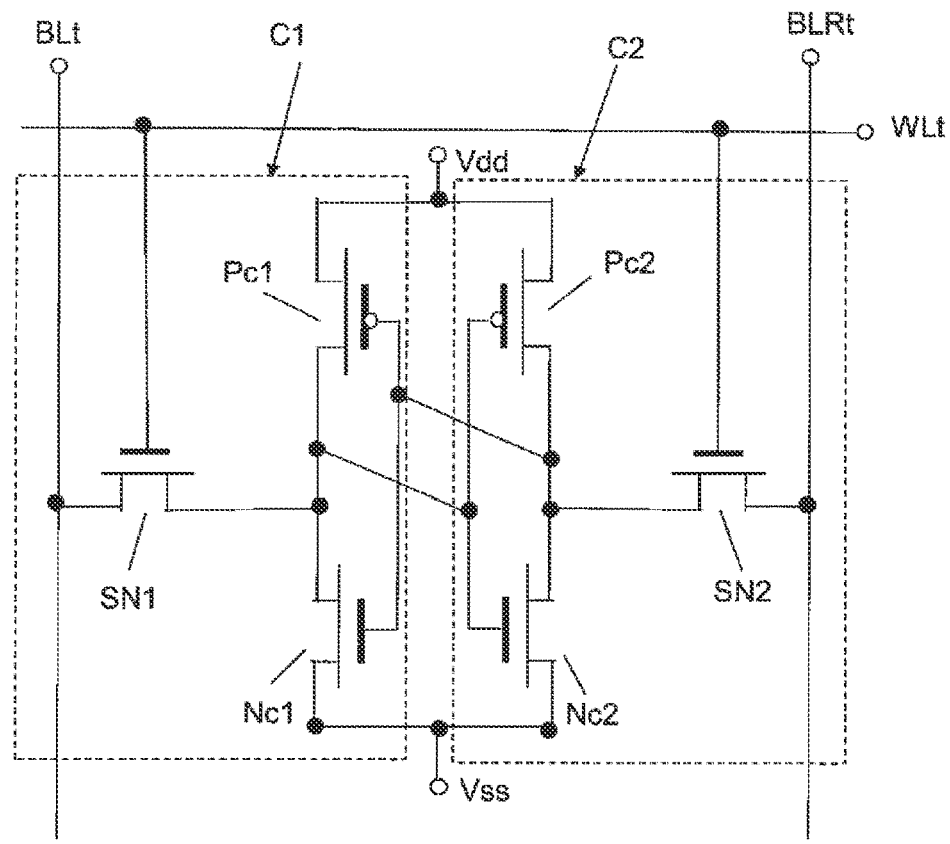
FIG. 7 is a circuit diagram of an SRAM cell using conventional SGTs.

In FIGS. 5A to 5C, upper surfaces of the Si pillars 6a to 6f before etching are left at the upper face of the Si pillars 6a to 6f after the etching. When the etching further proceeds, the upper surfaces of the Si pillars 6a to 6f vanish and their cross-sectional shape becomes triangular pyramid. Such differences in the shapes of the top of the Si pillars 6a to 6f may depend on, for example, thickness of the Si pillars 6a to 6f and conditions for anisotropic etchings. Features of this embodiment exist in forming orientation face in single crystal Si on the top of the Si pillars 6a to 6f by anisotropic etching.

This embodiment has features as follows.

In epitaxial crystal growth method, a single crystal layer grows continuously from arrangement of atoms of the surface of single crystal layers. In the first embodiment, since the exposed top of the Si pillars 6a to 6f in planar view has been etched by RIE etching, its side surfaces have many face orientations, and its crystallinity is not so good condition due to ion damage by the RIE. On the other hand, in this embodiment, by anisotropic etching of the top of the Si pillars 6a to 6f, the ion damage layer due to the RIE etching are removed and the side surfaces of the top of the Si pillars 6a to 6f have specific orientation face. Therefore, N$^+$ layers 32a, 32c, 32d, 32f and P$^+$ layers 32b, 32e having good crystallinity are formed. This leads to improvement of SGT properties.

In the embodiments according to the present invention, one SGT is formed at one semiconductor pillar, but the present invention can also be applied to any circuit formation in which two or more SGTs are formed. In such circuit formation in which two or more SGTs are formed, the SGT referred in the present invention is the topmost SGT on the semiconductor pillar.

In addition, in the first embodiment, Si pillars 6a to 6f are formed, but any semiconductor pillars consisting of other semiconductor material may be possible. This is also applicable to other embodiments according to the present invention.

In addition, N$^+$ layers 3aa, 3ab, 3ba, 3bb, 32a, 32c, 32d, 32f and P$^+$ layers 4aa, 4bb, 32b, 32e in the first embodiment may be formed by Si which contains donor or acceptor impurities, or other semiconductor materials. This is also applicable to other embodiments according to the present invention.

In addition, in the first embodiment, N$^+$ layers 32a, 32c, 32d, 32f and P$^+$ layers 32b, 32e are formed by using selective epitaxial crystal growth method. The N$^+$ layers 32a, 32c, 32d, 32f and the P$^+$ layers 32b, 32e may also be selectively formed by other methods, including a method for forming the N$^+$ layers 32a, 32c, 32d, 32f and the P$^+$ layers 32b, 32e on the top of the Si pillars 6a to 6f in recesses 30A to 30F by repeating CDE (Chemical Dry Etching) and usual epitaxial crystal growth. This is also applicable to other embodiments according to the present invention.

In addition, in the first embodiment, for a SiN layer 27 on the periphery of the Si pillars 6a to 6f, SiO$_2$ layers 28a to 28f formed on side surfaces of exposed top of Si pillars 6a to 6f and mask material layers 7a to 7f, and a SiN layer 29 surrounding the SiO$_2$ layer 28a to 28f, other material layers consisting of single or multiple layers including organic or inorganic materials may be used, as long as the materials are suitable for the purpose of the present invention. This is also applicable to other embodiments according to the present invention.

In addition, in the first embodiment, a mask material layer 7 is formed of a SiO$_2$ layer, an aluminum oxide (Al$_2$O$_3$, hereinafter referred as AlO) layer, and a SiO$_2$ layer. For the mask material layer 7, other material layers consisting of single or multiple layers including organic or inorganic materials may be used, as long as the materials are suitable for the purpose of the present invention. This is also applicable to other embodiments according to the present invention.

In addition, in the first embodiment, band-like SiN layers 13aa, 13ab, 13ba, 13bb entirely formed by ALD method are formed on each side of the band-like SiGe layers 8a, 8b, as shown in FIGS. 1CA to 1CC and FIGS. 1DA to 1DC. For the band-like SiN layers 13aa, 13ab, 13ba, 13bb and the band-like SiGe layers 8a, 8b, other material layers consisting of single or multiple layers including organic or inorganic materials may be used, as long as the materials are suitable for the purpose of the present invention. This is also applicable to other embodiments according to the present invention.

As described in FIGS. 1AA to 1GC, band-like mask material layers 17a, 17b extended in X direction orthogonal to band-like mask material layers 12aa, 12ab, 12ba, 12bb, 13aa, 13ab, 13ba, 13bb extended in Y direction are formed by a method similar to the method for forming the band-like SiN layers 13aa, 13ab, 13ba, 13bb. This make it possible to form Si pillars 6a to 6f with high precision and at high density both in X and Y directions. Then, in the description of the embodiment, the band-like mask material layers 17a, 17b are formed after forming the band-like mask material layers 12aa, 12ab, 12ba, 12bb, 13aa, 13ab, 13ba, 13bb. On the other hand, it may be also possible to form Si pillars 6a to 6f with high precision and at high density by a process in which the band-like SiN material layers 12aa, 12ab, 12ba, 12bb, 13aa, 13ab, 13ba, 13bb is formed after forming the band-like mask material layers 17a, 17b. Furthermore, in the design, when there is enough room in Y direction, the band-like mask material layers 17a, 17b may be directly formed by lithography and RIE etching method, without using the present method. Also, when there is enough room in X direction, the band-like mask material layers 13aa, 13ab, 13ba, 13bb may be directly formed by lithography and RIE etching method, without using the present method. Furthermore, if SRAM cell performance may be satisfied, band-like mask material layers 12aa, 12ab, 12ba, 12bb and band-like SiN layer 17a, 17b extended in X direction may be formed by using SADP (Self Aligned Double Patterning, see, for example, A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications," Proc. Of SPIE Vol. 9782, 2016), or SAQP (Self Aligned Quadruple Patterning, see, for example, A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications," Proc. Of SPIE Vol. 9782, 2016). This is also applicable to other embodiments according to the present invention.

In addition, as described in FIGS. 1HA to 1HC and FIGS. 1IA to 1IC, after forming SiN pillars 20a, 20b, 20c, 20d, 20e, 20f, 20g 20h having rectangular mask material layers 19a, 19b, 19c, 19d, 19e, 19f, 19g, 19h on their top, the rectangular mask material layers 19b, 19g and the SiN pillars 20b, 20g are removed. Thus, in planar view, areas for forming contact holes C1, C2 having no Si pillars are formed in areas in which the contact holes C1, C2 exist shown in FIGS. 1QA to 1QC. On the other hand, the areas for forming contact holes C1, C2 may be formed by forming Si pillars in the areas for forming contact holes C1, C2 at the same time of forming Si pillars 6a to 6f, and then removing the Si pillars. Also, the areas for forming contact holes C1, C2 may be formed by a method in which, after forming band-like mask material layers 17a, 17b, portions of the band-like mask material layer 17a, 17b in the areas for forming contact holes C1, C2 are removed such that Si pillars cannot be formed in the areas in which the contact holes C1, C2 are present. As mentioned above, there may be several methods other than those described in the first embodiment. The areas for forming contact holes C1, C2 may be formed by methods other than those methods. It is applicable to any circuit formation other than SRAM cell circuit. This is also applicable to other embodiments according to the present invention.

In addition, in the first embodiment, band-like mask material layers 9a, 9b, 12aa, 12ab, 12ba, 12bb are formed such that each upper surface and bottom positions in vertical direction are the same, but the each upper surface and bottom positions may be different in vertical direction, as long as being suitable for the purpose of the present invention. This is also applicable to other embodiments according to the present invention.

In addition, in the first embodiment, thickness and shape of band-like mask material layers 9a, 9b, 12aa, 12ab, 12ba, 12bb may be changed by CMP polishing, RIE etching, and cleaning. This change arises no problem when the change is within a range suitable for the purpose of the present invention. This is also applicable to other embodiments according to the present invention.

In addition, materials for various line metal layer such as XC1, XC2, WL, Vdd, Vss, BL, RBL may be not only metals but also any conductor material layers such as alloy, semiconductor layers containing large amount of acceptor or donor impurities, and the like, and these materials may be configured in a single layer or combined in multiple layers. This is also applicable to other embodiments according to the present invention.

Also, in the first embodiment, TiN layers 24a, 24b, 24c, 24d are used as a gate conductor layer, as shown in FIGS. 1JA to 1JC. For the TiN layers 24a, 24b, 24c, 24d, other material layers consisting of single or multiple layers may be used, as long as the materials are suitable for the purpose of the present invention. The TiN layers 24a, 24b, 24c, 24d may be formed by conductor layers, such as single or multiple metal layers, having at least desired work function. Outside of the layers, other conductive layers such as, for example, a W layer may be formed. In this case, the W layer serves as a metal line layer for linking gate conductor layers. Any single or multiple metal layers other than the W layer may be used. Although $HfO_2$ layer 23 is used as a gate insulating layer, other material layers consisting of single or multiple layers may be used. This is also applicable to other embodiments according to the present invention.

In the first embodiment, Si pillars 6a to 6f have circular shape in planar view. Then, some or all the Si pillars 6a to 6f may be easily formed to have a shape in planar view such as circular, elliptic, or elongated shape in one direction. Then, also in a logic circuit area formed to be separated from an SRAM area, mixture of Si pillars having different shapes in planar view may be formed in the logic circuit area depending on logic circuit design. These are also applicable to other embodiments according to the present invention.

In addition, in the first embodiment, $N^+$ layers 3aa, 3ab, 3ba, 3bb and $P^+$ layers 4aa, 4bb are formed in connection with bottoms of Si pillars 6a to 6f. Layers of metal or alloy such as silicide may be formed over upper surfaces of the $N^+$ layers 3aa, 3ab, 3ba, 3bb and $P^+$ layers 4aa, 4bb. Also, $P^+$ or $N^+$ layers including donor or acceptor impurity atoms formed by, for example, an epitaxial crystal growth method may be formed on periphery of bottoms of the Si pillars 6a to 6f, to form source or drain impurity regions of SGT. In this case, the $N^+$ or $P^+$ layers may or may not be formed inside of the Si pillars in contact with the $N^+$ or $P^+$ layer formed by the epitaxial crystal growth method. Alternatively, extended metal or alloy layers may be provided in contact with these $P^+$ and $N^+$ layers. As mentioned above, the formation of the impurity regions linked to the bottom of the Si pillars 6a to 6f and impurity layer-bonding regions for linking these impurity regions may be determined from the designing and manufacturing viewpoint. $N^+$ layers 3aa, 3ab, 3ba, 3bb and $P^+$ layers 4aa, 4bb may serve as both the impurity layer and the impurity layer-bonding region. This is also applicable to other embodiments according to the present invention.

In addition, in the first embodiment, SGTs are formed on a P layer substrate 1, but SOI (Silicon On Insulator) substrate may be used instead of the P layer substrate 1. Alternatively, any substrate of other materials may be used as long as it can serve as a substrate. This is also applicable to other embodiments according to the present invention.

In addition, in the first embodiment, an SGT is described in which $N^+$ layers 3aa, 3ab, 3ba, 3bb and $P^+$ layers 4aa, 4bb, and $N^+$ layers 32a, 32c, 3d, 3f, and $P^+$ layers 32b, 32e having conductivities of same polarity are used both above and below of Si pillars 6a to 6f to configure source and drain, but the present invention may also be applicable to tunnel-type SGTs having source and drain of different polarities. This is also applicable to other embodiments according to the present invention.

In addition, in the first embodiment, $N^+$ layers 32a, 32c, 32d, 32f and $P^+$ layers 32b, 32e are formed after forming a gate $HfO_2$ layer 23 and gate TiN layers 24a, 24b, 24c, 24d. On the other hand, the gate $HfO_2$ layer 23 and the gate TiN layers 24a, 24b, 24c, 24d may be formed after forming the $N^+$ layers 32a, 32c, 32d, 32f and $P^+$ layers 32b, 32e. This is also applicable to other embodiments according to the present invention.

Also, in a vertical-type NAND type flash memory circuit, a semiconductor pillar is made to be a channel, and multiple stage of memory cells configured by a tunnel oxide layer, a charge accumulation layer, an interlayer insulating layer, and a control conductor layer surrounding the semiconductor pillar are formed in a vertical direction. At the semiconductor pillars on each end of these memory cells, a source line impurity layer which corresponds to a source and a bit line impurity layer which corresponds to a drain exist. In addition, for one memory cell, when there are other memory cells on each side of the one memory cell, if one of the other memory cells is a source, then the other one serves as a drain. Thus, the vertical-type NAND type flash memory circuit is a type of SGT circuits. Therefore, the present invention may be applicable to a circuit in which NAND type flash memory circuit are also exist.

In the present invention, various embodiments and modification will be possible without departing from the broader sprit and scope of the present invention. Also, the foregoing embodiments are intended to illustrate one example of the present invention and not intended to limit the scope of the present invention. The foregoing examples and variations may be arbitrarily combined. Furthermore, if necessary, even if a part of constituent features of the foregoing embodiments is removed, it will be within the technical idea of the present invention.

According to a manufacturing method of a pillar-shaped semiconductor device of the present invention, a high-density pillar-shaped semiconductor device can be obtained.

What is claimed is:

1. A manufacturing method for manufacturing a pillar-shaped semiconductor device comprising:

a first semiconductor pillar standing in a first direction and having a first gate insulating layer formed along the first direction to at least partially surround the first semiconductor pillar, a first gate conductor layer formed along the first direction to at least partially surround the first gate insulating layer, a first impurity layer connected to a top of the first semiconductor pillar and a third impurity layer connected to a lower part of the first semiconductor pillar, wherein the first semiconductor pillar forms a first SGT (surrounding gate transistor) channel between the first and third impurity layers; and a second semiconductor pillar standing in the first direction adjacent to the first semiconductor pillar and having a second gate insulating layer formed along the first direction to at least partially surround the second semiconductor pillar, a second gate conductor layer formed along the first direction to at least partially the second gate insulating layer, a second impurity layer connected to a top of the second semiconductor pillar, a fourth impurity layer connected to a lower part of the second semiconductor pillar, wherein the second semiconductor pillar forms a second SGT channel between the second and fourth impurity layers, the method comprising:

(i) forming a first insulating layer in a second direction perpendicular to the first direction on the first gate conductor layer and the second gate conductor layer, wherein the first insulating layer surrounds the first semiconductor pillar and the second semiconductor pillar at a location lower than the tops of the first semiconductor pillar and the second semiconductor pillar;

(ii) forming a first material layer along the first direction on the first insulating layer to at least partially surround an upper portion of the first semiconductor pillar, and a second material layer along the first direction on the first insulating layer to at least partially surround an upper portion of the second semiconductor pillar, wherein the first and second material layers are formed spaced from each other;

(iii) forming a second insulating layer in the second direction on the first insulating layer to surround the first material layer and the second material layer;

(iv) removing the first material layer and the second material layer and exposing the upper portion of the first semiconductor pillar and the upper portion of the second semiconductor pillar so that the tops of the first and second semiconductor pillars are located lower than an upper surface of the second insulating layer and higher than an upper surface of the first insulating layer; and (v) forming the first impurity layer in a single crystal structure containing one of donor or acceptor impurity atoms to cap the top of the first semiconductor pillar and at least partially surrounds the exposed upper portion of the first semiconductor pillar, wherein the first impurity layer has an upper surface equal in height to or lower than the upper surface of the second insulating layer, and forming the second impurity layer in a single crystal structure containing donor or acceptor impurity atoms to cap the top of the second semiconductor pillar and at least partially surrounds the exposed upper portion of the second semiconductor pillar, wherein the second impurity layer has an upper surface equal in height to or lower than the upper surface of the second insulating layer, (vi) wherein the method further comprises forming a third material layer on the top of the first semiconductor pillar, wherein the third material layer has a cross section in the second direction identical to that of the first semiconductor pillar, and a fourth material layer on the top of the second semiconductor pillar, wherein the fourth material layer has a cross section in the second direction identical to that of the second semiconductor pillar, (vii) wherein the step (ii) comprising forming the first material layer in the first direction to at least partially surround the upper portion of the first semiconductor pillar and the third material layer, and forming the second material layer in the first direction to at least partially surround the upper portion of the second semiconductor layer and the fourth material layer, (viii) wherein the method further comprises removing the third material layer and the fourth material layer after forming the step (iii),and (ix) wherein the first gate conductor layer and the second gate conductor layer are formed in electrical contact through strips of circumferential contact areas of the first and second gate conductor layers that run in the first direction in parallel coextensively with the SGT channel of the first semiconductor pillar and the SGT channel of the second semiconductor pillar.

2. The method according to claim 1, wherein the step (v) comprises forming the first impurity layer and the second impurity layer by selective epitaxial crystal growth method.

3. The method according to claim 1, wherein the step (v) comprises steps of:

lowering the exposed upper portion of the first semiconductor pillar to have the top thereof lower than the upper surface of the second insulating layer and higher than the upper surface of the first insulating layer; and lowering the exposed upper portion of the second semiconductor pillar to have the top thereof lower than the upper surface of the second insulating layer and higher than the upper surface of the first insulating layer.

4. The method according to claim 1, wherein the step (iv) further comprises a step of exposing a first surface of the second insulating layer facing the exposed upper portion of the first semiconductor pillar and a second surface of the second insulating layer facing the exposed upper portion of the second semiconductor pillar and further exposing a part of the upper surface of the first insulating layer between the exposed portion of the first semiconductor pillar and the exposed first surface of the second insulating layer and between the exposed portion of the second semiconductor pillar and the exposed second surface of the second insulating layer, and the step (v) further comprises, before forming the first impurity layer and the second impurity layer, forming a single crystal thin film semiconductor layer on the exposed upper portion of the first semiconductor pillar and the exposed upper portion of the second semiconductor pillar, on the exposed first and second surfaces of the second insulating layer, and on the exposed part of the upper surface of the first insulating layer.

5. The method according to claim 1, wherein the step (v) comprises a step of subjecting the exposed upper portion of the first semiconductor pillar and the exposed upper portion of the second semiconductor pillar to an anisotropic etching.

6. The method according to claim 1, wherein the step (v) comprises steps of:
before forming the first and second impurity layers, forming an oxidized layer on each of the top of the first semiconductor pillar and the top of the second semiconductor pillar; and
removing the oxidized layer.

7. The method according to claim 1, comprising a step of:
forming a first conductor layer made of a metal or alloy on a top of the first impurity layer so that the first conductor layer has an upper surface coplanar with the upper surface of the second insulating layer; and
forming a second conductor layer made of a metal or alloy on a top of the second impurity layer so that second conductor layer has an upper surface coplanar with the upper surface of the second insulating layer.

8. The method according to claim 1, wherein the step (v) comprises steps of:
Forming, by an epitaxial crystal growth method, a fifth impurity layer around the exposed upper portion of the first semiconductor pillar, the exposed upper portion of the second semiconductor pillar and on the second insulating layer; and
removing the fifth impurity layer such that the fifth impurity layer has an upper surface coplanar with or lower than the upper surface of the second insulating layer.

9. The method according to claim 1, comprising a step of subjecting each of the top of the first semiconductor pillar and the top of the second semiconductor pillar to an anisotropic etching before forming the first impurity layer and the second impurity layer.

10. The method according to claim 1, further comprising steps of:
forming a fifth material layer over a semiconductor layer formed on the substrate;
forming four or five band-like first mask material layers in parallel to and separated from each other in the first direction on the fifth material layer;
forming two band-like second mask material layers in parallel to and separated from each other in the second direction below or above the band-like first mask material layers;
forming a third mask material layer consisting of at least part of the fifth material layer, the band-like first mask material layers, and the band-like second mask layers, wherein the band-like first mask material layers and the band-like second mask material layers are overlapped with each other; and
etching the semiconductor layer with the third mask material layer used as a mask to form a first set of semiconductor pillars aligned on a first line, and a second set of semiconductor pillars aligned on a second line parallel to the first line, wherein the first set of semiconductor pillars include a third semiconductor pillar present on one end of the first line, the second set of semiconductor pillars include a fourth semiconductor pillar present on an end opposite to one end of the second line, and a fifth semiconductor pillar is present and has a center at which a first center line extending through a center of the third semiconductor pillar, orthogonal to the first line and the second line cross, a sixth semiconductor pillar is present and has a center at which a second center line extending through a center of the fourth semiconductor pillar, orthogonal to the second line and the first line cross, a seventh semiconductor pillar is present and has a center on the first line and being adjacent to the sixth semiconductor pillar, and an eighth semiconductor pillar is present and has a center on the second line and being adjacent to the fifth semiconductor pillar;

wherein, in planar view, a first semiconductor pillar-absent area having no semiconductor pillar of the first set of semiconductor pillars is present in, at least a part being overlapped on, a first band area, the first band area being an extension of insides of two tangential lines of periphery of the eighth semiconductor pillar, the two tangential lines being parallel to the first center line, and a second semiconductor pillar-absent area having no semiconductor pillar of the second set of semiconductor pillars is formed in, at least a part being overlapped on, a second band area, the second band area being an extension of insides of two tangential line of periphery of the seventh semiconductor pillar, the two tangential lines being parallel to the second center line;

wherein when one of the fifth semiconductor pillar and the eighth semiconductor pillar is the first semiconductor pillar, the other is the second semiconductor pillar, and similarly, when one of the sixth semiconductor pillar and the seventh semiconductor pillar is the first semiconductor pillar, the other is the second semiconductor pillar;

wherein a first contact hole connecting a first impurity region formed being linked to a bottom of the first set of semiconductor pillars, and the first gate conductor layer and the second gate conductor layer of the fifth semiconductor pillar and the eighth semiconductor pillar is formed on the first semiconductor pillar-absent area, and a second contact hole connecting a second impurity region formed being linked to a bottom of the second set of semiconductor pillars, and the first gate conductor layer and the second gate conductor layer of the sixth semiconductor pillar and the seventh semiconductor pillar is formed on the second semiconductor pillar-absent area; and wherein the first impurity region and the second impurity region both include the third impurity layer and the fourth impurity layer.

* * * * *